(12) United States Patent
Hong et al.

(10) Patent No.: US 9,373,793 B2
(45) Date of Patent: Jun. 21, 2016

(54) COMPOUND AND ORGANIC LIGHT-EMITTING DEVICE USING SAME

(75) Inventors: Sung Kil Hong, Daejeon (KR); Yun Hwan Kim, Seoul (KR); Jungoh Huh, Seoul (KR); Seongmi Cho, Gyeongsangbuk-do (KR); Seong So Kim, Gyeonggi-do (KR); Yongbum Cha, Seoul (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/125,186

(22) PCT Filed: Jun. 20, 2012

(86) PCT No.: PCT/KR2012/004872
§ 371 (c)(1),
(2), (4) Date: Dec. 10, 2013

(87) PCT Pub. No.: WO2013/002509
PCT Pub. Date: Jan. 3, 2013

(65) Prior Publication Data
US 2014/0183489 A1  Jul. 3, 2014

(30) Foreign Application Priority Data
Jun. 27, 2011 (KR) .................. 10-2011-0062395

(51) Int. Cl.
*H01L 51/50* (2006.01)
*H01L 51/00* (2006.01)
*C09K 11/06* (2006.01)

(52) U.S. Cl.
CPC ............ *H01L 51/0061* (2013.01); *C09K 11/06* (2013.01); *H01L 51/0052* (2013.01); *H01L 51/0059* (2013.01); *H01L 51/0072* (2013.01); *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/1092* (2013.01); *H01L 51/0051* (2013.01); *H01L 51/0085* (2013.01); *H01L 51/5016* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| 9,126,970 | B2 | 9/2015 | Pflumm et al. |
| 2008/0193797 | A1 | 8/2008 | Heil et al. |
| 2009/0261717 | A1 | 10/2009 | Buesing et al. |
| 2010/0032658 | A1 | 2/2010 | Lee et al. |
| 2010/0201259 | A1 | 8/2010 | Kobayashi |
| 2011/0037063 | A1 | 2/2011 | Buesing et al. |
| 2011/0062429 | A1 | 3/2011 | Kai et al. |
| 2011/0210318 | A1 | 9/2011 | Bae et al. |
| 2012/0068170 | A1* | 3/2012 | Pflumm ............... C07D 209/82 257/40 |
| 2012/0097899 | A1 | 4/2012 | Parham et al. |

(Continued)

FOREIGN PATENT DOCUMENTS

| CN | 101248156 A | 8/2008 |
| DE | 102009023155 A1 | 12/2010 |

(Continued)

*Primary Examiner* — Gregory Clark
(74) *Attorney, Agent, or Firm* — Dentons US LLP

(57) ABSTRACT

The present invention provides a novel compound that is capable of largely improving a life span, efficiency, electrochemical stability and thermal stability of an organic light emitting device, and an organic light emitting device in which the compound is included in an organic compound layer.

12 Claims, 2 Drawing Sheets

(56) References Cited

U.S. PATENT DOCUMENTS

| | | |
|---|---|---|
| 2012/0206037 A1 | 8/2012 | Lee et al. |
| 2014/0077179 A1* | 3/2014 | Shin .................... C07D 403/04 257/40 |

FOREIGN PATENT DOCUMENTS

| | | | |
|---|---|---|---|
| KR | 10-2006-0023046 A1 | 3/2006 | |
| KR | 10-2010-0007780 A | 1/2010 | |
| KR | 10-2010-0023783 A | 3/2010 | |
| KR | 1020110041726 A | 4/2011 | |
| KR | 2011-0132721 * | 12/2011 | ............ C09K 11/06 |
| TW | 201109305 A1 | 3/2011 | |
| WO | 2009-017056 A1 | 2/2009 | |
| WO | 2009-127307 A1 | 10/2009 | |
| WO | 2009-136595 A1 | 11/2009 | |
| WO | 2010107244 A2 | 9/2010 | |
| WO | WO 2010/107244 * | 9/2010 | ............ C09K 11/06 |
| WO | 2010126234 A1 | 11/2010 | |
| WO | 2010/136109 A1 | 12/2010 | |
| WO | 2011/000455 A1 | 1/2011 | |

\* cited by examiner

COMPOUND AND ORGANIC LIGHT-EMITTING DEVICE USING SAME

This application is a 371 National Stage Application of International Application No. PCT/KR2012/004872, filed on Jun. 20, 2012, which claims priority to and claims benefit of Korean Patent Application No. 10-2011-0062395, filed Jun. 27, 2011, the entire contents of which are incorporated herein by reference.

TECHNICAL FIELD

The present invention relates to an organic light emitting device in which a novel compound that is capable of largely improving a life span, efficiency, electrochemical stability and thermal stability of the organic light emitting device is included in an organic compound layer.

BACKGROUND ART

An organic light emitting phenomenon is an example of a conversion of current into visible rays by an internal process of a specific organic molecule. The organic light emitting phenomenon is based on the following principle. When an organic material layer is interposed between an anode and a cathode, if voltage is applied between two electrodes, electrons and holes are injected from the cathode and the anode to the organic material layer. The electrons and the holes injected into the organic material layer are recombined to form an exciton, and the exciton is reduced to a bottom state to emit light. The organic light emitting device using the principle may be generally constituted by a cathode, an anode, and an organic material layer interposed therebetween, for example, an organic material layer including a hole injection layer, a hole transport layer, a light emitting layer and an electron transport layer.

The material used in the organic light emitting device is mostly a pure organic material or a complex compound of an organic material and metal, and may be classified into a hole injection material, a hole transport material, a light emitting material, an electron transport material, an electron injection material and the like according to the purpose. Herein, an organic material having a p-type property, that is, an organic material easily oxidized and electrochemically stable while the organic material is oxidized, is mainly used as the hole injection material or the hole transport material. Meanwhile, an organic material having an n-type property, that is, an organic material easily reduced and electrochemically stable while the organic material is reduced, is mainly used as the electron injection material or the electron transport material. A material having both p-type and n-type properties, that is, a material that is stable while the material is oxidized and reduced, is preferable as the light emitting layer material, and a material having high light emitting efficiency for conversion of the exciton into light when the exciton is formed is preferable.

In addition, it is preferable that the material used in the organic light emitting device further have the following properties.

First, it is preferable that the material used in the organic light emitting device have excellent thermal stability. The reason is because joule heat is generated by movement of electric charges in the organic light emitting device. Recently, since NPB, which has mainly been used as the hole transport layer material, has a glass transition temperature of 100° C. or lower, there is a problem in that it is difficult to apply NPB to an organic light emitting device requiring a high current.

Second, holes or electrons injected into the organic light emitting device should be smoothly transported to a light emitting layer, and the injected holes and electrons should not be released out of the light emitting layer in order to obtain an organic light emitting device that is capable of being driven at low voltage and has high efficiency. To this end, a material used in the organic light emitting device should have an appropriate band gap and HOMO or LUMO energy level. In the case of PEDOT:PSS currently used as a hole transport material in an organic light emitting device manufactured by a solution coating method, since a LUMO energy level thereof is lower than that of an organic material used as a light emitting layer material, it is difficult to manufacture an organic light emitting device having high efficiency and a long life span.

In addition, the material used in the organic light emitting device should have excellent chemical stability, electric charge mobility, and interfacial characteristic with an electrode or an adjacent layer. That is, the material used in the organic light emitting device should be little deformed by moisture or oxygen. Further, appropriate hole or electron mobility should be ensured so as to balance densities of the holes and of the electrons in the light emitting layer of the organic light emitting device to maximize the formation of excitons. Additionally, an interface with an electrode including metal or metal oxides should be favorable so as to ensure stability of the device.

Accordingly, there is a need to develop an organic material having the aforementioned requirements in the art.

PRIOR ART DOCUMENT

Patent Document

Korean Patent Application Laid-Open No. 2006-0023046

DISCLOSURE

Technical Problem

The present invention has been made in an effort to provide an organic light emitting device including a compound that can satisfy conditions required in the material capable of being used in the organic light emitting device, for example, an appropriate energy level, electrochemical stability, thermal stability and the like, and has a chemical structure performing various roles required in the organic light emitting device according to a substituent group.

Technical Solution

An exemplary embodiment of the present invention provides a compound represented by the following Formula 1.

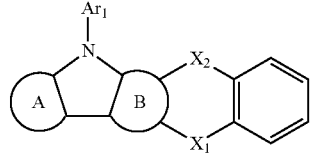

[Formula 1]

In Formula 1,

A and B are the same as or different from each other, and each independently substituted or unsubstituted phenyl or substituted or unsubstituted naphthalene, at least one of A and B is substituted or unsubstituted naphthalene, Ar$_1$ is a substituted or unsubstituted aryl group or a substituted or unsubstituted heterocyclic group, X$_1$ and X$_2$ are the same as or different from each other, and each independently CR'R", NR or a direct bond, R, R' and R" are the same as or different from each other, and each independently selected from the group consisting of hydrogen; heavy hydrogen; a halogen group; a nitrile group; a nitro group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; a substituted or unsubstituted heterocyclic group including one or more of N, O and S atoms, or —N(L)(Y); —CO—N(L)(Y); and —COO-L, and L and Y are the same as or different from each other, and each independently selected from the group consisting of hydrogen, a halogen group, an alkyl group, an alkoxy group, a substituted or unsubstituted aryl group, a substituted or unsubstituted arylalkyl group, a substituted or unsubstituted arylalkenyl group, a substituted or unsubstituted heterocyclic group, a substituted or unsubstituted carbazolyl group, a substituted or unsubstituted fluorenyl group, a nitrile group and an acetyl group.

Another exemplary embodiment of the present invention provides an organic light emitting device including: a first electrode, a second electrode, and one or more organic material layers interposed between the first electrode and the second electrode, wherein one or more layers of the organic material layers include the compound of Formula 1.

Advantageous Effects

A compound according to the present invention may be used as an organic material layer material, particularly, a hole injection material and/or a hole transport material in an organic light emitting device, and in the case where the compound is used in the organic light emitting device, driving voltage of the device is lowered, light efficiency is improved, and a life span property of the device is improved because of thermal stability of the compound.

BEST MODE

Figure 1:
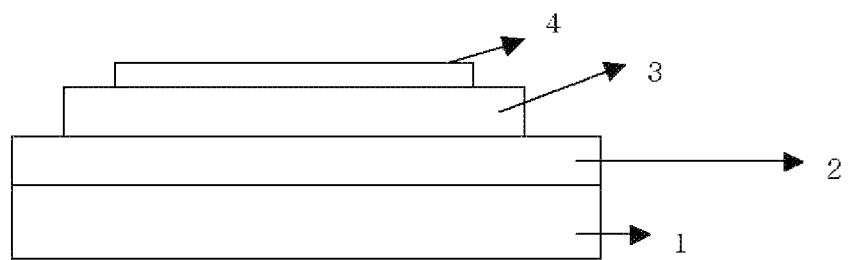
FIG. 1 illustrates an example of an organic light emitting device including a substrate 1, an anode 2, a light emitting layer 3 and a cathode 4.

Hereinafter, the present invention will be described in more detail.

The present invention provides a compound represented by Formula 1.

A and B of Formula 1 are the same as or different from each other, and each substituted or unsubstituted phenyl or substituted or unsubstituted naphthalene.

In the exemplary embodiment of the present invention, substituted phenyl or substituted naphthalene of A and B of Formula 1 means that phenyl or naphthalene is substituted by one or more substituent groups selected from the group consisting of heavy hydrogen, a halogen group, a substituted or unsubstituted alkyl group, a substituted or unsubstituted alkenyl group, a substituted or unsubstituted alkoxy group, a substituted or unsubstituted silyl group, a substituted or unsubstituted arylalkenyl group, a substituted or unsubstituted aryl group, a substituted or unsubstituted heteroaryl group, a substituted or unsubstituted carbazole group, a substituted or unsubstituted arylamine group, a substituted or unsubstituted fluorenyl group and a nitrile group, or has no substituent group.

In another exemplary embodiment, substituted or unsubstituted phenyl or substituted or unsubstituted naphthalene of A and B of Formula 1 means that phenyl or naphthalene is substituted by an alkyl group substituted or unsubstituted by one or more substituent groups selected from the group consisting of a halogen group, an alkyl group, an alkenyl group, an alkoxy group, an arylamine group, an aryl group, an arylalkyl group, an arylalkenyl group, a heterocyclic group, a carbazolyl group, a fluorenyl group and a nitrile group, or has no substituent group.

In the exemplary embodiment of the present invention, Ar$_1$ of Formula 1 is selected from the group consisting of an aryl group substituted or unsubstituted by one or more substituent groups selected from the group consisting of a halogen group, an alkyl group, an alkenyl group, an alkoxy group, an arylamine group, an aryl group, an arylalkyl group, an arylalkenyl group, a heterocyclic group, a carbazolyl group, a fluorenyl group and a nitrile group; and a heterocyclic group that is substituted or unsubstituted by one or more substituent groups selected from the group consisting of a halogen group, an alkyl group, an alkenyl group, an alkoxy group, an arylamine group, an aryl group, an arylalkyl group, an arylalkenyl group, a heterocyclic group, a carbazolyl group, a fluorenyl group and a nitrile group and includes O, N or S as a heteroatom.

In the present invention, in the case where Ar$_1$ of Formula 1 is a substituted or unsubstituted aryl group or a substituted or unsubstituted heterocyclic group, efficiency of the organic light emitting device is higher than that of the case where Ar$_1$ is an alkyl group.

In another exemplary embodiment, R is selected from the group consisting of a substituted or unsubstituted phenyl group, a substituted or unsubstituted biphenyl group, a substituted or unsubstituted triphenyl group, a substituted or unsubstituted terphenyl group, a substituted or unsubstituted stilbene group, a substituted or unsubstituted naphthyl group, a substituted or unsubstituted anthracenyl group, a substituted or unsubstituted phenanthrenyl group, a substituted or unsubstituted pyrenyl group, a substituted or unsubstituted perylenyl group, a substituted or unsubstituted tetracenyl group, a substituted or unsubstituted fluorenyl group, a substituted or unsubstituted acenaphthacenyl group, a substituted or unsubstituted triphenylene group and a substituted or unsubstituted fluoranthene group.

In the exemplary embodiment of the present invention, R' and R" are the same as or different from each other, and each independently an alkyl group substituted or unsubstituted by one or more substituent groups selected from the group consisting of a halogen group, an alkyl group, an alkenyl group, an alkoxy group, an arylamine group, an aryl group, an arylalkyl group, an arylalkenyl group, a heterocyclic group, a carbazolyl group, a fluorenyl group and a nitrile group.

In the compound according to the present invention, substituent groups of Formula 1 will be described in more detail below.

Examples of the halogen group may include fluorine, chlorine, bromine, iodine and the like, but are not limited thereto.

The alkyl group may be a straight or branched chain, and the number of carbon atoms is not particularly limited but is preferably 1 to 12. Specific examples thereof include a methyl group, an ethyl group, a propyl group, an isopropyl group, a butyl group, a t-butyl group, a pentyl group, a hexyl group, a heptyl group and the like, but are not limited thereto.

The cycloalkyl group is not particularly limited, the number of carbon atoms is preferably 3 to 60, and a cyclopentyl group and a cyclohexyl group are particularly preferable.

The alkenyl group may be a straight or branched chain, and the number of carbon atoms is not particularly limited but is preferably 2 to 12. Specific examples thereof include an alkenyl group connected to an aryl group such as a stylbenyl group and a styrenyl group, but are not limited thereto.

It is preferable that the alkoxy group have 1 to 12 carbon atoms, and more specific examples thereof may include methoxy, ethoxy, isopropyloxy and the like, but are not limited thereto.

The aryl group may be a monocycle or a polycycle, and the number of carbon atoms is not particularly limited but is preferably 6 to 60. Examples of the monocyclic aryl group may include a phenyl group, a biphenyl group, a terphenyl group, stilben and the like, and examples of the polycyclic aryl group may include a naphthyl group, an anthracenyl group, a phenanthrene group, a pyrenyl group, a perylenyl group, a cryxenyl group, a fluorene group and the like, but are not limited thereto.

The heterocyclic group is a cyclic group including O, N or S as a heteroatom, and the number of carbon atoms is not particularly limited, but is preferably 3 to 30. Examples of the heterocyclic group include a carbazole group, a thiophene group, a furan group, a pyrrole group, an imidazole group, a thiazole group, an oxazole group, an oxadiazole group, a triazole group, a pyridyl group, a pyradazine group, a quinolynyl group, an isoquinolyn group, an acrydyl group and the like, and the compounds of the following Structural Formulas are preferable but are not limited thereto.

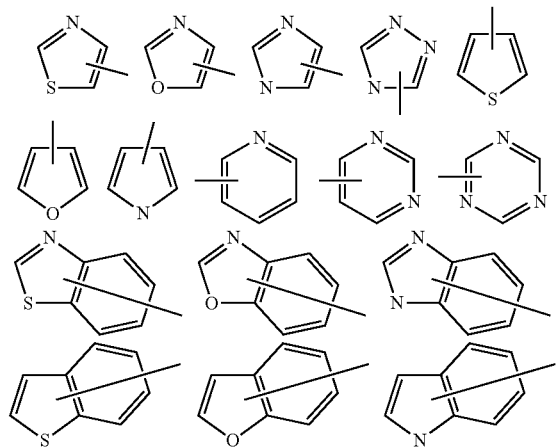

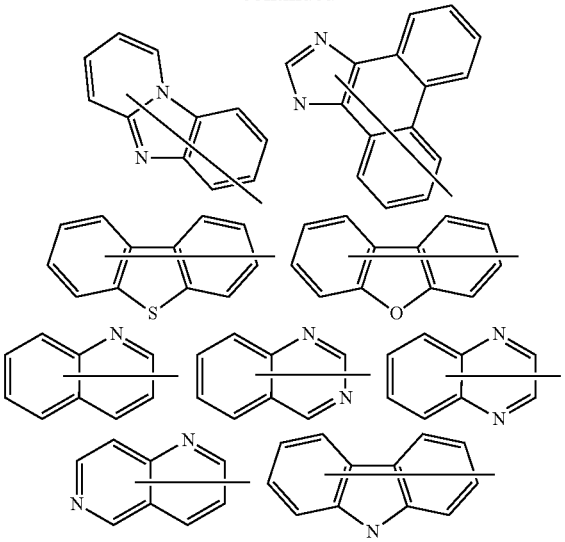

The fluorenyl group has a structure where two cyclic organic compounds are connected through one atom, and examples thereof include

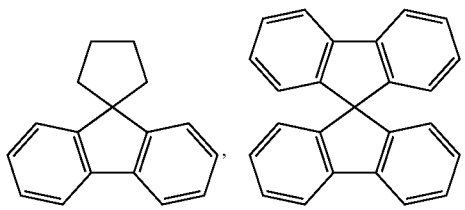

and the like.

In the present invention, the fluorenyl group includes a structure of an opened fluorenyl group, the opened fluorenyl group has a structure where one cyclic compound is disconnected in the structure where two cyclic compounds are connected through one atom, and examples thereof include

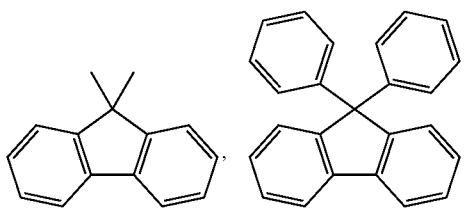

and the like.

The number of carbon atoms of the amine group is not particularly limited, but preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

Examples of the arylamine group mean a substituted or unsubstituted monocyclic diarylamine group, a substituted or unsubstituted polycyclic diarylamine group or a substituted or unsubstituted monocyclic and polycyclic diarylamine group.

The aryl group of the aryloxy group, the arylthioxy group, the arylsulfoxy group and the aralkylamine group is the same as the aforementioned examples of the aryl group.

The alkyl group of the alkylthioxy group, the alkylsulfoxy group, the alkylamine group and the aralkylamine group is the same as the aforementioned examples of the alkyl group.

In the present invention, the heteroaryl group of the heteroarylamine group may be selected from the aforementioned examples of the heterocyclic group.

Further, in the present specification, the term "substituted or unsubstituted" means that substitution is performed by one or more substituent groups selected from the group consisting of heavy hydrogen, a halogen group, an alkyl group, an alkenyl group, an alkoxy group, a silyl group, an arylalkenyl group, an aryl group, a heteroaryl group, a carbazole group, an arylamine group, and a fluorenyl group and a nitrile group substituted or unsubstituted by an aryl group, or there is no substituent group.

In the exemplary embodiment of the present invention, A and B are the same as or different from each other, and each independently a substituted or unsubstituted naphthalene or a substituted or unsubstituted phenyl, and at least one of A and B is naphthalene.

In another exemplary embodiment, A may be substituted or unsubstituted naphthalene, and B may be substituted or unsubstituted phenyl.

In another exemplary embodiment, A may be substituted or unsubstituted phenyl, and B may be substituted or unsubstituted naphthalene.

Further, Formula 1 may be represented by any one of the following Formulas 2 to 5.

[Formula 2]

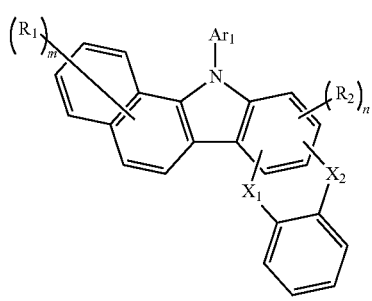

[Formula 3]

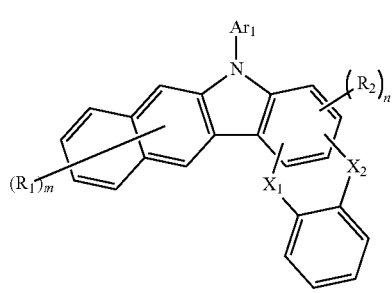

[Formula 4]

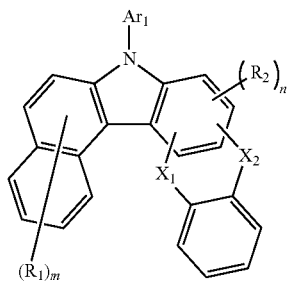

[Formula 5]

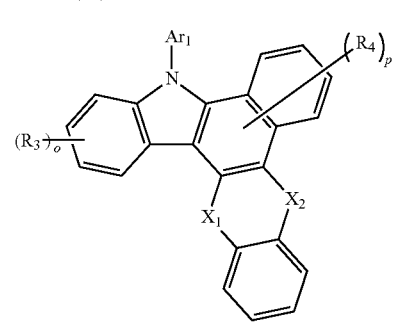

In Formulas 2 to 5, $Ar_1$, $X_1$ and $X_2$ are the same as definitions of Formula 1, m is an integer of 1 to 6, n is an integer of 1 to 2, o and p are each an integer of 1 to 4, and $R_1$ to $R_4$ are the same as or different from each other, and each independently hydrogen, heavy hydrogen, a halogen group, a substituted or unsubstituted alkyl group, a substituted or unsubstituted alkenyl group, a substituted or unsubstituted alkoxy group, a substituted or unsubstituted silyl group, a substituted or unsubstituted arylalkenyl group, a substituted or unsubstituted aryl group, a substituted or unsubstituted heterocycle group, a substituted or unsubstituted carbazole group, a substituted or unsubstituted arylamine group, a substituted or unsubstituted fluorenyl group or a nitrile group.

In the exemplary embodiment of the present invention, $X_1$ and $X_2$ are the same as or different from each other, and each independently CR'R", NR or a direct bond.

In another exemplary embodiment, $X_1$ and $X_2$ are each CR'R" or NR.

In another exemplary embodiment, $X_1$ is CR'R", and $X_2$ is NR.

In another exemplary embodiment, $X_1$ is NR, and $X_2$ is CR'R".

In another exemplary embodiment, $X_1$ and $X_2$ are each CR'R" or a direct bond.

In another exemplary embodiment, $X_1$ is CR'R", and $X_2$ is a direct bond.

In another exemplary embodiment, $X_1$ is a direct bond, and $X_2$ is CR'R".

In another exemplary embodiment, m is 1.

In another exemplary embodiment, o is 1.

In another exemplary embodiment, both $R_2$ and $R_4$ are hydrogen.

Formula 1 according to the present invention may be represented by any one of Formulas 1-1 to 1-10.

[Formula 1-1]
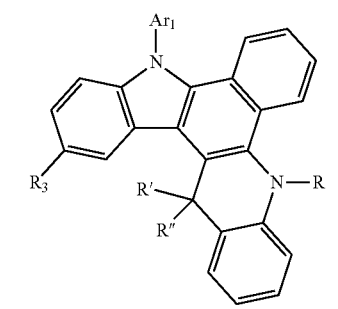

[Formula 1-2]
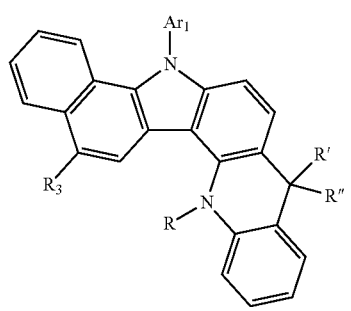

[Formula 1-3]
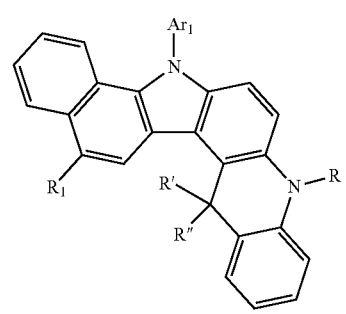

[Formula 1-4]
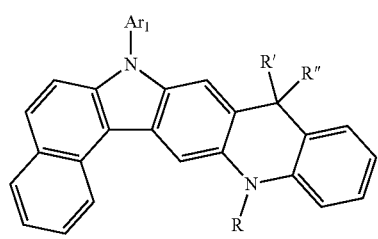

[Formula 1-5]
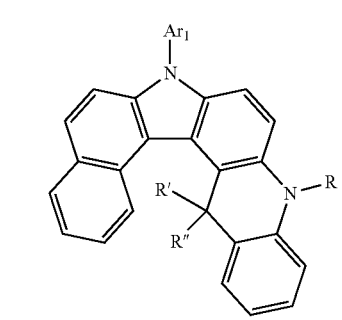

[Formula 1-6]
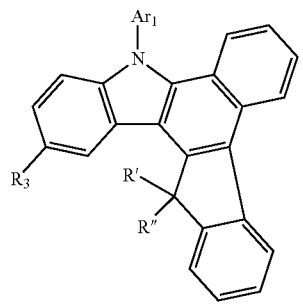

[Formula 1-7]
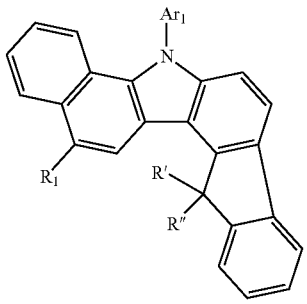

[Formula 1-8]
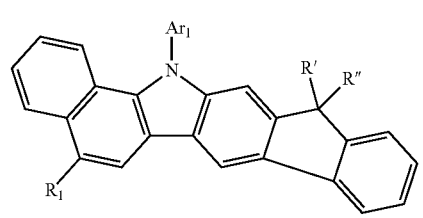

[Formula 1-9]
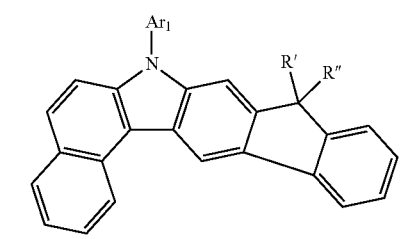

[Formula 1-10]
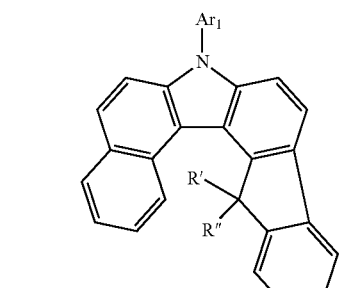

In the Formula represented by Formulas 1-1 to 1-10, $Ar_1$, R, R' and R" are the same as definitions of Formula 1, and $R_1$ and $R_3$ are the same as or different from each other, and each independently hydrogen, heavy hydrogen, a halogen group, a substituted or unsubstituted alkyl group, a substituted or unsubstituted alkenyl group, a substituted or unsubstituted alkoxy group, a substituted or unsubstituted silyl group, a substituted or unsubstituted arylalkenyl group, a substituted or unsubstituted aryl group, a substituted or unsubstituted heterocycle group, a substituted or unsubstituted carbazole group, a substituted or unsubstituted arylamine group, a substituted or unsubstituted fluorenyl group or a nitrile group.

Examples of substituent groups further substituted to $Ar_1$, R, R', R", $R_1$ and $R_3$ of Formula 1-1 to Formula 1-10 may include a halogen group, an alkyl group, an alkenyl group, an alkoxy group, a silyl group, an arylalkenyl group, an aryl group, a heteroaryl group, a carbazole group, an arylamine group, a fluorenyl group substituted or unsubstituted by an aryl group, a nitrile group and the like, but are not limited thereto.

In the exemplary embodiment of the present invention, R' and R" are the same as or different from each other, and each independently a substituted or unsubstituted alkyl group, or a substituted or unsubstituted aryl group.

In another example thereof, R' and R" are the same as or different from each other, and each independently a substituted or unsubstituted methyl group.

In another example thereof, R' and R" are the same as or different from each other, and each independently a substituted or unsubstituted phenyl group.

It is preferable that R' and R" be the same as each other.

In the exemplary embodiment of the present invention, $R_1$ is hydrogen, a substituted or unsubstituted aryl group or a substituted or unsubstituted arylamine group.

In another exemplary embodiment, $R_1$ is hydrogen.

In another exemplary embodiment, $R_1$ is a substituted or unsubstituted phenyl group.

In another exemplary embodiment, $R_1$ is a phenyl group substituted by an arylamine group.

In another exemplary embodiment, $R_1$ is a phenyl group substituted by an arylamine group substituted by a phenyl group.

In another exemplary embodiment, $R_1$ is an arylamine group substituted by a phenyl group or a naphthyl group.

In the exemplary embodiment of the present invention, $R_3$ is hydrogen, a substituted or unsubstituted aryl group or a substituted or unsubstituted arylamine group.

In another exemplary embodiment, $R_3$ is hydrogen.

In another exemplary embodiment, $R_3$ is a substituted or unsubstituted phenyl group.

In another exemplary embodiment, $R_3$ is a phenyl group substituted by an arylamine group.

In another exemplary embodiment, $R_3$ is a phenyl group substituted by an amine group substituted by a phenyl group.

In another exemplary embodiment, $R_3$ is an arylamine group substituted by a phenyl group or a naphthyl group.

In the exemplary embodiment of the present invention, $Ar_1$ is a substituted or unsubstituted aryl group or a substituted or unsubstituted heterocyclic group.

In another exemplary embodiment, $Ar_1$ is a substituted or unsubstituted phenyl group.

In another exemplary embodiment, $Ar_1$ is a phenyl group.

In another exemplary embodiment, $Ar_1$ is a phenyl group substituted by an arylamine group.

In another exemplary embodiment, $Ar_1$ is a phenyl group substituted by an amine group substituted by a phenyl group.

In another exemplary embodiment, $Ar_1$ is a phenyl group substituted by a substituted or unsubstituted carbazole group.

In another exemplary embodiment, $Ar_1$ is a phenyl group substituted by a carbazole group substituted by a phenyl group.

In another exemplary embodiment, $Ar_1$ is a phenyl group substituted by a substituted or unsubstituted thiophene group.

In another exemplary embodiment, $Ar_1$ is a phenyl group substituted by a thiophene group substituted by a phenyl group.

In another exemplary embodiment, $Ar_1$ is a phenyl group substituted by a substituted or unsubstituted triazine group.

In another exemplary embodiment, $Ar_1$ is a phenyl group substituted by a triazine group substituted by a phenyl group.

In another exemplary embodiment, in $Ar_1$, a substituted phenyl group is a phenylene group, and

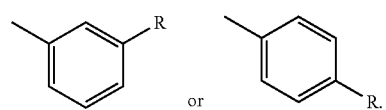

Herein, R is a substituted or unsubstituted aryl group, a substituted or unsubstituted arylamine group or a substituted or unsubstituted heterocyclic group.

In another exemplary embodiment, $Ar_1$ is a substituted or unsubstituted biphenyl group.

In another exemplary embodiment, $Ar_1$ is a substituted or unsubstituted fluorenyl group.

In another exemplary embodiment, $Ar_1$ is a fluorenyl group substituted by an alkyl group.

In another exemplary embodiment, $Ar_1$ is a substituted or unsubstituted carbazole group.

In another exemplary embodiment, $Ar_1$ is a carbazole group substituted by a phenyl group.

In another exemplary embodiment, $Ar_1$ is a substituted or unsubstituted quinoline group.

In another exemplary embodiment, $Ar_1$ is a substituted or unsubstituted triazine group.

In another exemplary embodiment, $Ar_1$ is a triazine group substituted by a phenyl group.

In the exemplary embodiment of the present invention, R is a substituted or unsubstituted aryl group or a substituted or unsubstituted heterocyclic group.

In the exemplary embodiment of the present invention, R is a substituted or unsubstituted phenyl group.

In the exemplary embodiment of the present invention, R is a substituted or unsubstituted biphenyl group.

In the exemplary embodiment of the present invention, R is a biphenyl group substituted by a carbazole group.

In the exemplary embodiment of the present invention, R is a substituted or unsubstituted fluorenyl group.

In the exemplary embodiment of the present invention, R is a fluorenyl group substituted by an alkyl group.

In the exemplary embodiment of the present invention, R is a substituted or unsubstituted carbazole group.

In the exemplary embodiment of the present invention, R is a carbazole group substituted by a phenyl group.

Further, examples of the compound represented by any one of Formulas 1-1 to 1-3 include compounds having a substituent group of any one of A-1 to A-24 of the following Table 1, but are not limited thereto.

| A | 1-1 | 1-2 | 1-3 |
|---|---|---|---|
| Formula | 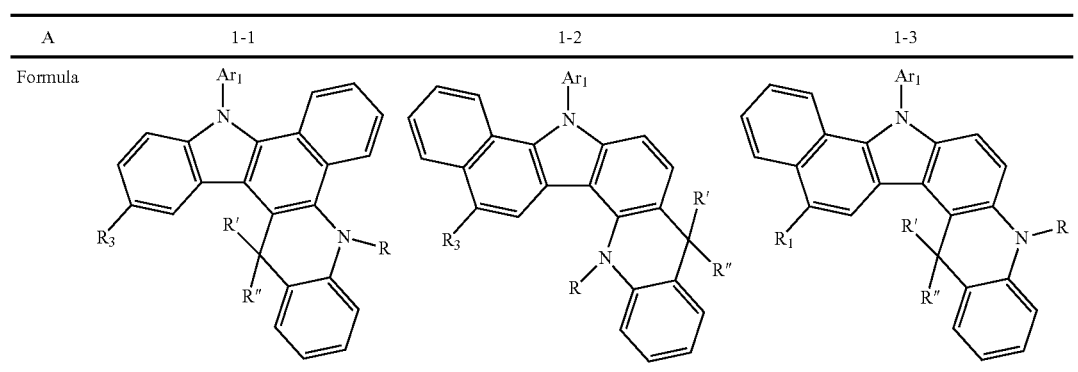 | | |
TABLE 1
| | R' | R'' | $R_1$ or $R_3$ | $Ar_1$ | R |
|---|---|---|---|---|---|
| A-1 | —$CH_3$ | —$CH_3$ | —H | phenyl | phenyl |
| A-2 | —$CH_3$ | —$CH_3$ | —H | phenyl | biphenyl |
| A-3 | —$CH_3$ | —$CH_3$ | —H | biphenyl | phenyl |
| A-4 | —$CH_3$ | —$CH_3$ | —H | N-phenylcarbazol-3-yl | phenyl |
| A-5 | —$CH_3$ | —$CH_3$ | —H | phenyl | N-phenylcarbazol-3-yl |
| A-6 | —$CH_3$ | —$CH_3$ | —H | 9,9-dimethylfluoren-2-yl | phenyl |
| A-7 | —$CH_3$ | —$CH_3$ | —H | phenyl | 9,9-dimethylfluoren-2-yl |

TABLE 1-continued
| | R' | R'' | R₁ or R₃ | Ar₁ | R |
|---|---|---|---|---|---|
| A-8 | —CH₃ | —CH₃ | —H | 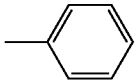 | 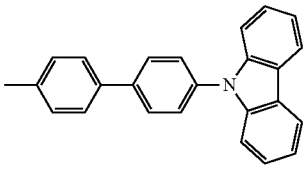 |
| A-9 | —CH₃ | —CH₃ | 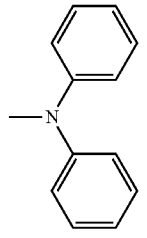 | 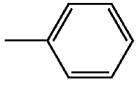 | 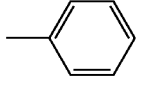 |
| A-10 | —CH₃ | —CH₃ | —H | 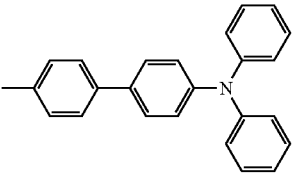 | 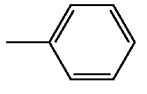 |
| A-11 | —CH₃ | —CH₃ | —H | 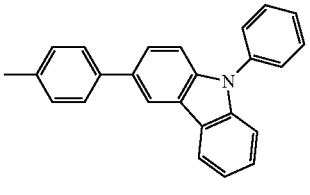 | 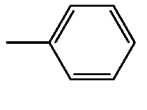 |
| A-12 | —CH₃ | —CH₃ | 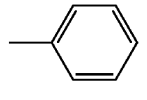 | 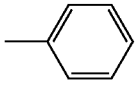 | 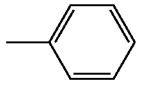 |
| A-13 | —CH₃ | —CH₃ | 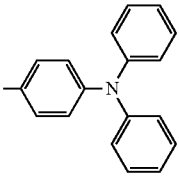 | 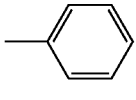 | 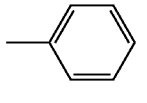 |
| A-14 | 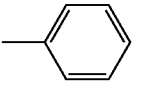 | 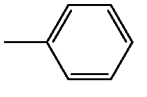 | —H | 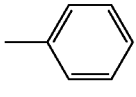 | 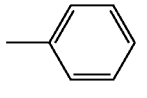 |
| A-15 | 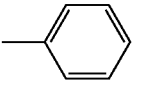 | 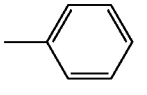 | —H | 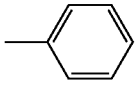 | 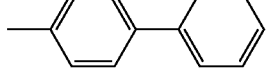 |
| A-16 | 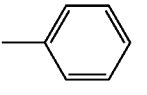 | 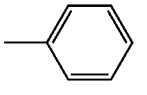 | —H | 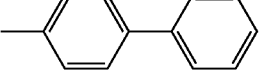 | 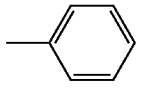 |

TABLE 1-continued

Further, examples of the compound represented by any one of Formulas 1-4 and 1-5 include compounds having a substituent group of any one of B-1 to B-19 of the following Table 1.
| B | 1-4 | 1-5 |
|---|---|---|
| Formula | 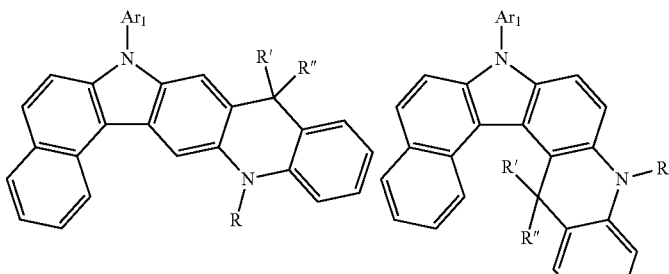 | 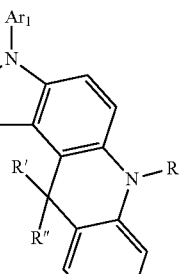 |
TABLE 2
| | R' | R" | $Ar_1$ | R |
|---|---|---|---|---|
| B-1 | —$CH_3$ | —$CH_3$ | 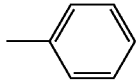 | 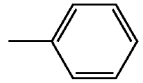 |
| B-2 | —$CH_3$ | —$CH_3$ | 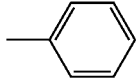 | 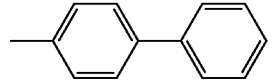 |
| B-3 | —$CH_3$ | —$CH_3$ | 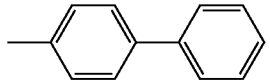 | 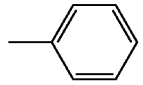 |
| B-4 | —$CH_3$ | —$CH_3$ | 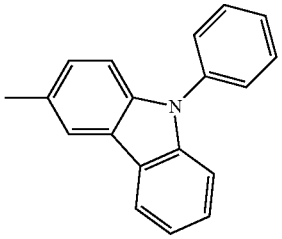 | 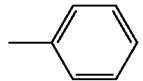 |
| B-5 | —$CH_3$ | —$CH_3$ | 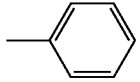 | 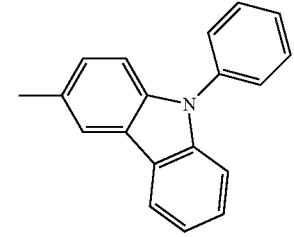 |
| B-6 | —$CH_3$ | —$CH_3$ | 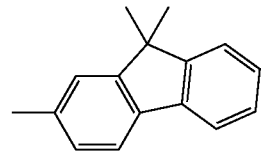 | 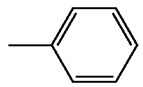 |

TABLE 2-continued

| | R' | R'' | Ar₁ | R |
|---|---|---|---|---|
| B-7 | —CH₃ | —CH₃ | phenyl | 9,9-dimethylfluorenyl |
| B-8 | —CH₃ | —CH₃ | phenyl | 4'-(9H-carbazol-9-yl)biphenyl |
| B-9 | —CH₃ | —CH₃ | 4'-(diphenylamino)biphenyl | phenyl |
| B-10 | —CH₃ | —CH₃ | 4-(9-phenyl-9H-carbazol-3-yl)phenyl | phenyl |
| B-11 | phenyl | phenyl | phenyl | phenyl |
| B-12 | phenyl | phenyl | phenyl | biphenyl |
| B-13 | phenyl | phenyl | biphenyl | phenyl |
| B-14 | phenyl | phenyl | 9-phenyl-9H-carbazol-3-yl | phenyl |

TABLE 2-continued
| | R' | R" | Ar₁ | R |
|---|---|---|---|---|
| B-15 |  |  | 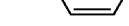 | 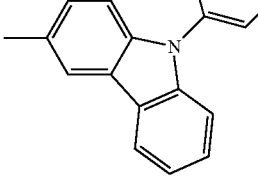 |
| B-16 |  |  | 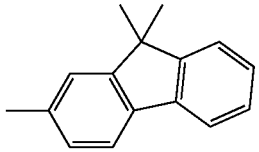 | 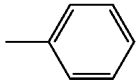 |
| B-17 |  |  |  | 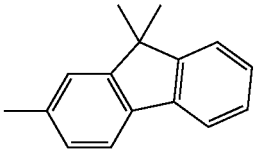 |
| B-18 |  |  |  | 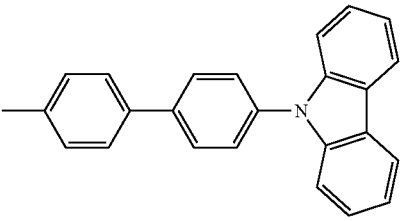 |
| B-19 |  |  | 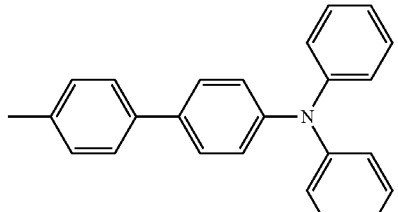 | 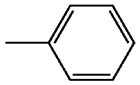 |
Further, examples of the compound represented by any one of Formulas 1-6 to 1-8 include compounds having a substituent group of any one of C-1 to C-32 of the following Table 1, but are not limited thereto.
| C | 6 | 7 | 8 |
|---|---|---|---|
| Formula | 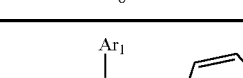 | 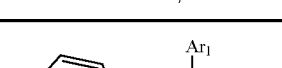 |  |

TABLE 3

|  | R' | R" | R₁ or R₃ | Ar₁ |
|---|---|---|---|---|
| C-1 | —CH₃ | —CH₃ | —H | phenyl |
| C-2 | —CH₃ | —CH₃ | —H | biphenyl |
| C-3 | —CH₃ | —CH₃ | —H | 9,9-dimethylfluorenyl |
| C-4 | —CH₃ | —CH₃ | —H | 2-phenyl-5-(phenyl)thiophene |
| C-5 | —CH₃ | —CH₃ | —H | 4'-(diphenylamino)biphenyl |
| C-6 | —CH₃ | —CH₃ | —H | 9-phenyl-3-(phenyl)carbazole |
| C-7 | —CH₃ | —CH₃ | —H | 9-phenyl-3-methylcarbazole |

TABLE 3-continued
| | R' | R" | R₁ or R₃ | Ar₁ |
|---|---|---|---|---|
| C-8 | —CH₃ | —CH₃ | —H | 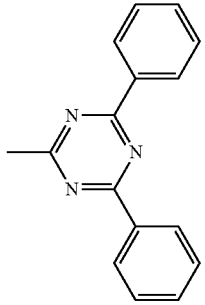 |
| C-9 | —CH₃ | —CH₃ | —H | 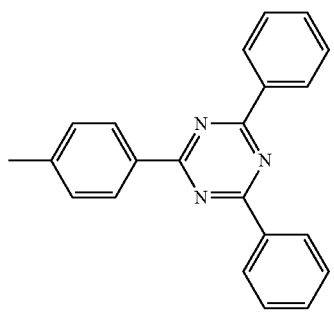 |
| C-10 | —CH₃ | —CH₃ | —H | 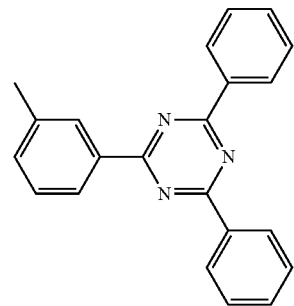 |
| C-11 | —CH₃ | —CH₃ | —H | 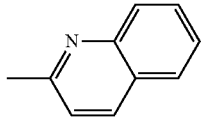 |
| C-12 | —CH₃ | —CH₃ | 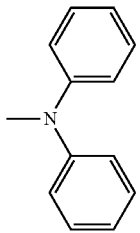 | 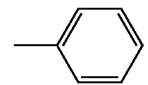 |

TABLE 3-continued
| | R' | R'' | R₁ or R₃ | Ar₁ |
|---|---|---|---|---|
| C-13 | —CH₃ | —CH₃ | 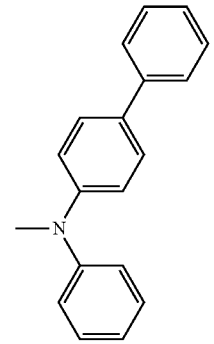 | 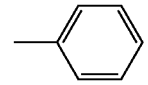 |
| C-14 | —CH₃ | —CH₃ | 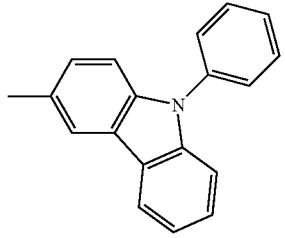 | 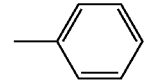 |
| C-15 | —CH₃ | —CH₃ | 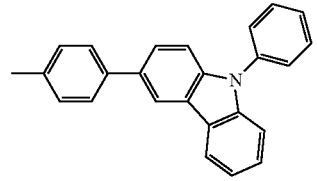 |  |
| C-16 | —CH₃ | —CH₃ | 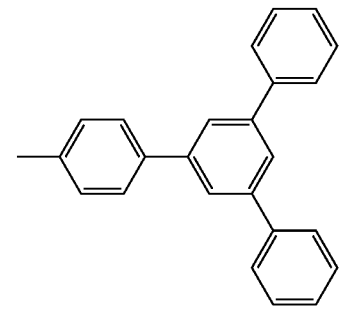 | 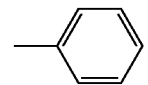 |
| C-17 | 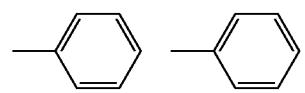 | 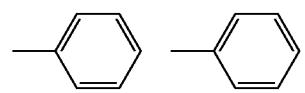 | —H | 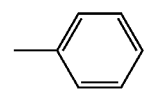 |
| C-18 | 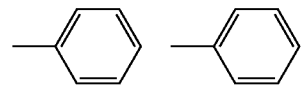 | 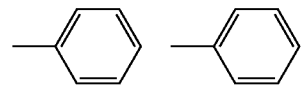 | —H | 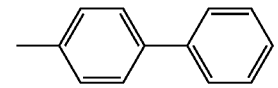 |
| C-19 | 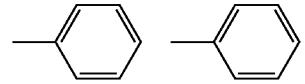 | 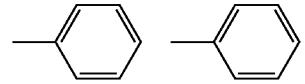 | —H | 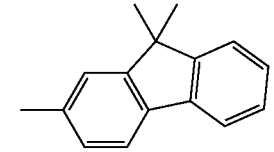 |

TABLE 3-continued

| | R' | R'' | R₁ or R₃ | Ar₁ |
|---|---|---|---|---|
| C-20 | phenyl | phenyl | —H | 5-phenylthiophen-2-yl attached to 3-methylphenyl |
| C-21 | phenyl | phenyl | —H | 4'-(diphenylamino)biphenyl-4-yl (methyl-substituted) |
| C-22 | phenyl | phenyl | —H | 9-phenyl-9H-carbazol-3-yl (methyl-substituted) |
| C-23 | phenyl | phenyl | —H | 9-phenyl-9H-carbazol-2-yl (methyl-substituted) |
| C-24 | phenyl | phenyl | —H | 4,6-diphenyl-1,3,5-triazin-2-yl (methyl-substituted) |
| C-25 | phenyl | phenyl | —H | 4,6-diphenyl-1,3,5-triazin-2-yl via 4-methylphenyl |

TABLE 3-continued

| | R' | R'' | R₁ or R₃ | Ar₁ |
|---|---|---|---|---|
| C-26 | phenyl | phenyl | —H | 2-(3-methylphenyl)-4,6-diphenyl-1,3,5-triazine |
| C-27 | phenyl | phenyl | —H | 2-methylquinolin-yl |
| C-28 | phenyl | phenyl | N,N-diphenylamino | phenyl |
| C-29 | phenyl | phenyl | N-phenyl-N-(biphenyl-4-yl)amino | phenyl |
| C-30 | phenyl | phenyl | 9-phenyl-9H-carbazol-3-yl | phenyl |
| C-31 | phenyl | phenyl | 9-phenyl-6-(4-methylphenyl)-9H-carbazol-3-yl | phenyl |

TABLE 3-continued
| | R' | R" | R₁ or R₃ | Ar₁ |
|---|---|---|---|---|
| C-32 | 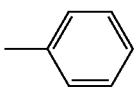 | 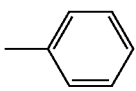 | 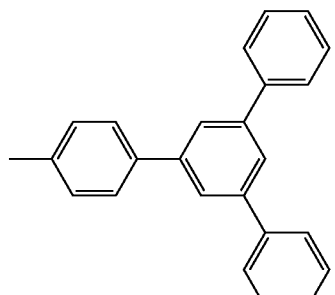 | 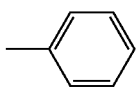 |
Further, examples of the compound represented by any one of Formulas 1-9 and 1-10 include compounds having a substituent group of any one of D-1 to D-22 of the following Table 1, but are not limited thereto.
| D | 9 | 10 |
|---|---|---|
| Formula | 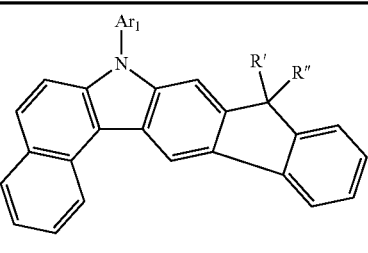 | 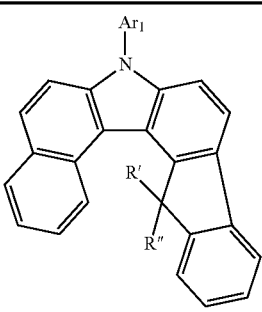 |
TABLE 4
| Formula | R' | R" | Ar₁ |
|---|---|---|---|
| D-1 | —CH₃ | —CH₃ |  |
| D-2 | —CH₃ | —CH₃ | 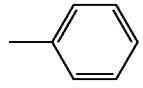 |
| D-3 | —CH₃ | —CH₃ | 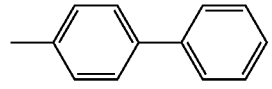 |
| D-4 | —CH₃ | —CH₃ | 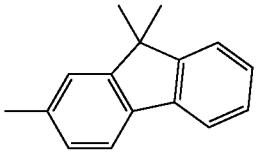 |

TABLE 4-continued
| Formula | R' | R" | Ar₁ |
|---|---|---|---|
| D-5 | —CH₃ | —CH₃ | 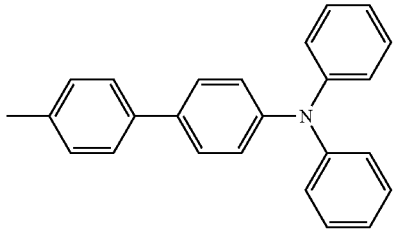 |
| D-6 | —CH₃ | —CH₃ | 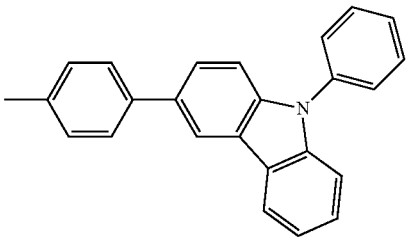 |
| D-7 | —CH₃ | —CH₃ | 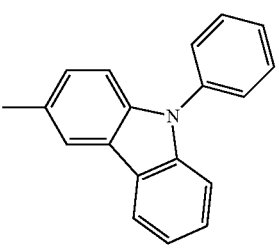 |
| D-8 | —CH₃ | —CH₃ | 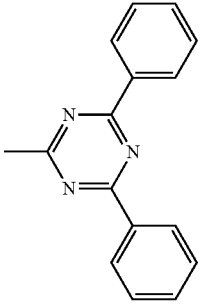 |
| D-9 | —CH₃ | —CH₃ | 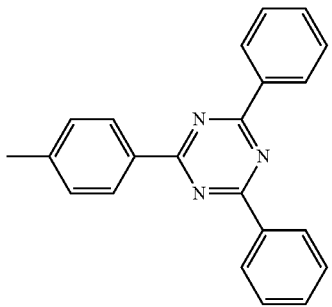 |

TABLE 4-continued
| Formula | R' | R'' | Ar₁ |
|---|---|---|---|
| D-10 | —CH₃ | —CH₃ | 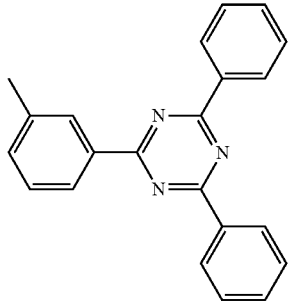 |
| D-11 | —CH₃ | —CH₃ | 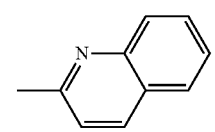 |
| D-12 | 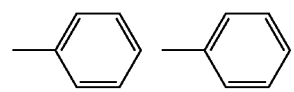 | 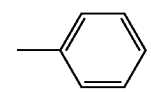 | 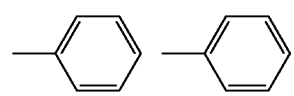 |
| D-13 | 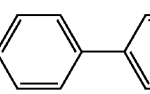 |  | 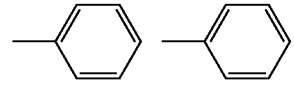 |
| D-14 |  |  | 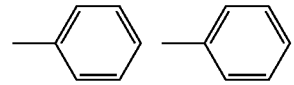 |
| D-15 |  | 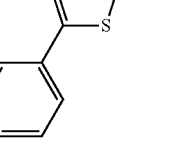 | 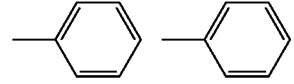 |
| D-16 | 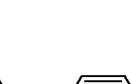 | 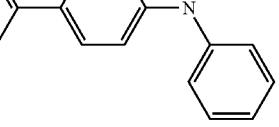 | 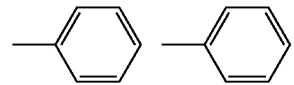 |
| D-17 | 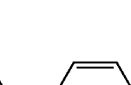 | 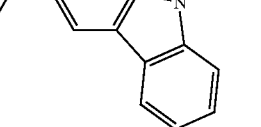 | |

TABLE 4-continued

| Formula | R' | R" | Ar₁ |
|---|---|---|---|
| D-18 | tolyl | phenyl | 9-phenyl-carbazol-3-yl (methyl-substituted) |
| D-19 | tolyl | phenyl | 4,6-diphenyl-1,3,5-triazin-2-yl |
| D-20 | tolyl | phenyl | 4,6-diphenyl-1,3,5-triazin-2-yl (via p-tolyl linker) |
| D-21 | tolyl | phenyl | 4,6-diphenyl-1,3,5-triazin-2-yl (via m-tolyl linker) |
| D-22 | tolyl | phenyl | quinolin-2-yl |

Formulas A-x and B-x are generally manufactured by the following process.

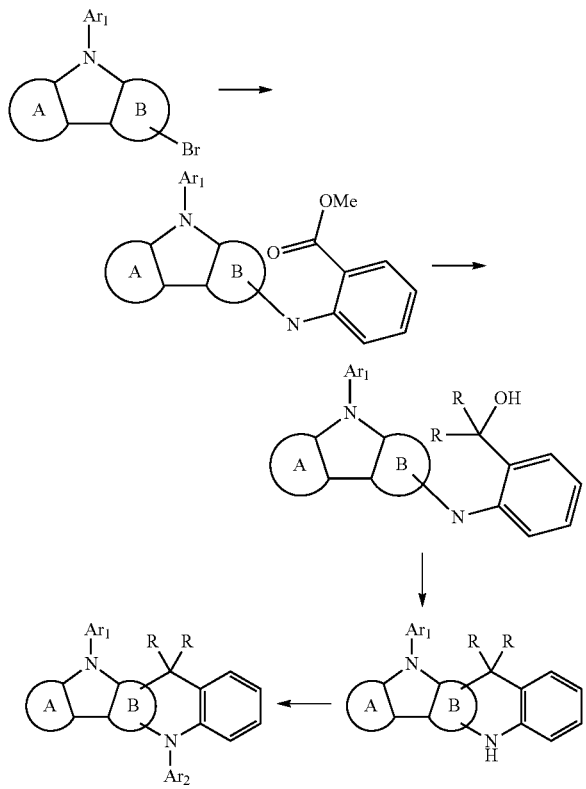

Formulas C-x and D-x are generally manufactured by the following process.

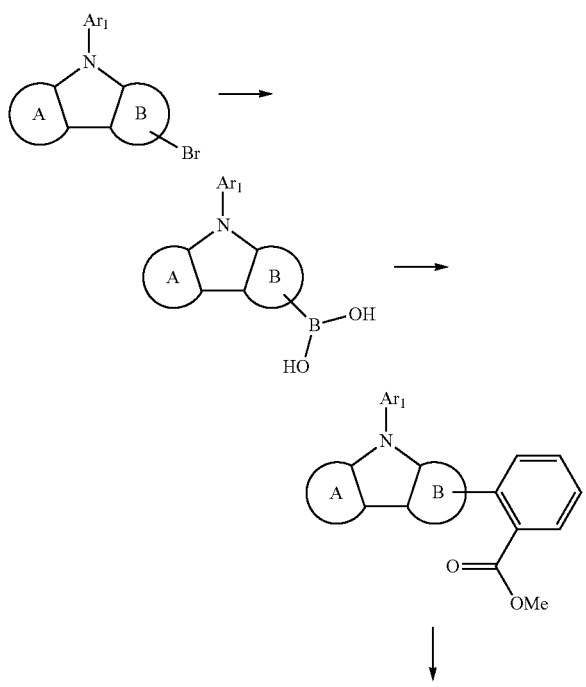

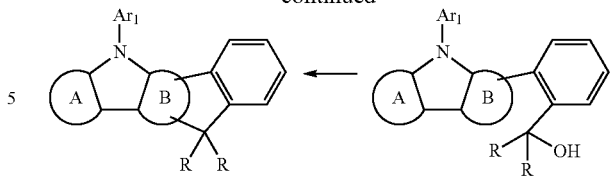
-continued

The conjugation length of the compound has a close relationship with an energy band gap. Specifically, the energy band gap is reduced as the conjugation length of the compound increases. As described above, since the core of the compound includes a limited conjugation, the core has a large energy band gap.

In the present invention, it is possible to synthesize the compound having various energy band gaps by introducing various substituent groups to positions of $Ar_1$, R, R' and R" of the core structure having the large energy band gap as described above. Generally, it is easy to control the energy band gap by introducing the substituent group to the core structure having the large energy band gap, but in the case where the core structure has the small energy band gap, it is difficult to control the energy band gap so as to increase by introducing the substituent group. Further, in the present invention, it is possible to control HOMO and LUMO energy levels of the compound by introducing various substituent groups to positions of $Ar_1$, R, R' and R" of the aforementioned core structure.

In addition, compounds having intrinsic characteristics of the introduced substituent groups may be synthesized by introducing various substituent groups to the aforementioned core structure. For example, it is possible to synthesize a material satisfying conditions required in each organic material layer by introducing the substituent group mainly used in a hole injection layer material, a hole transport material, a light emitting layer material and an electron transport layer material used to manufacture the organic light emitting device to the core structure.

Since the compound includes an amine structure in the core structure, the compound may have an appropriate energy level as the hole injection and/or hole transport material in the organic light emitting device. In the present invention, it is possible to implement a device having low driving voltage and high light efficiency by selecting the compound having an appropriate energy level according to the substituent group among the compounds and using the compound in the organic light emitting device.

In addition, the energy band gap can be finely controlled, a property at an interface between organic materials can be improved, and the purpose of the material can become various by introducing various substituent groups to the core structure.

Meanwhile, the compound has a high glass transition temperature (Tg), such that thermal stability is excellent. Such increase in thermal stability is an important factor providing driving stability to the device.

In addition, the organic light emitting device according to the present invention is an organic light emitting device including a first electrode, a second electrode, and one or more organic material layers interposed between the first electrode and the second electrode, and one or more layers of the organic material layers include the compound.

The organic light emitting device according to the present invention may be manufactured by using a manufacturing method and a material of a general organic light emitting device, except that one or more organic material layers are formed by using the aforementioned compound.

The compound may be formed to the organic material layer by a solution coating method as well as a vacuum deposition method when the organic light emitting device is manufactured. Herein, the solution coating method means spin coating, dip coating, inkjet printing, screen printing, a spray method, roll coating and the like, but is not limited thereto.

The organic material layer of the organic light emitting device of the present invention may have a single layer structure, or a multilayered structure in which two or more organic material layers are laminated. For example, the organic light emitting device of the present invention may have a structure including a hole injection layer, a hole transport layer, a light emitting layer, an electron transport layer, an electron injection layer and the like as an organic material layer. However, the structure of the organic light emitting device is not limited thereto, but may include a smaller number of organic material layers.

Accordingly, in the organic light emitting device of the present invention, the organic material layer may include one or more layers of the hole injection layer, the hole transport layer, and the layer injecting and transporting holes simultaneously, and one or more layers of the layers may include the compound represented by Formula 1.

In another exemplary embodiment, the organic material layer includes the light emitting layer, and the light emitting layer includes the compound represented by Formula 1. In an example thereof, the compound represented by Formula 1 may be included as a phosphorescent host material of the light emitting layer.

In another example thereof, the organic material layer including the compound represented by Formula 1 may include the compound represented by Formula 1 as a host, and may include another organic compound, metal or a metal compound as a dopant.

In another example thereof, the organic material layer including the compound represented by Formula 1 may include the compound represented by Formula 1 as a host, and may be used together with an iridium-based (Ir) dopant.

Further, the organic material layer may include one or more layers of an electron transport layer, an electron injection layer, and a layer transporting and injecting electrons simultaneously, and one or more layers of the layers may include the compound.

In another exemplary embodiment, the organic material layer of the organic electron device includes the hole transport layer, and the hole transport layer includes the compound represented by Formula 1.

In the organic material layer having the multilayered structure, the compound may be included in a light emitting layer, a layer injecting/transporting holes and emitting light simultaneously, a layer transporting holes and emitting light simultaneously, a layer transporting electrons and emitting light simultaneously or the like. For example, the structure of the organic light emitting device of the present invention may have a structure shown in FIGS. 1 and 2, but is not limited thereto.

FIG. 1 illustrates an organic light emitting device having a structure where an anode 2, a light emitting layer 3 and a cathode 4 are sequentially laminated on a substrate 1. In the aforementioned structure, the compound may be included in the light emitting layer 3.

Figure 2:
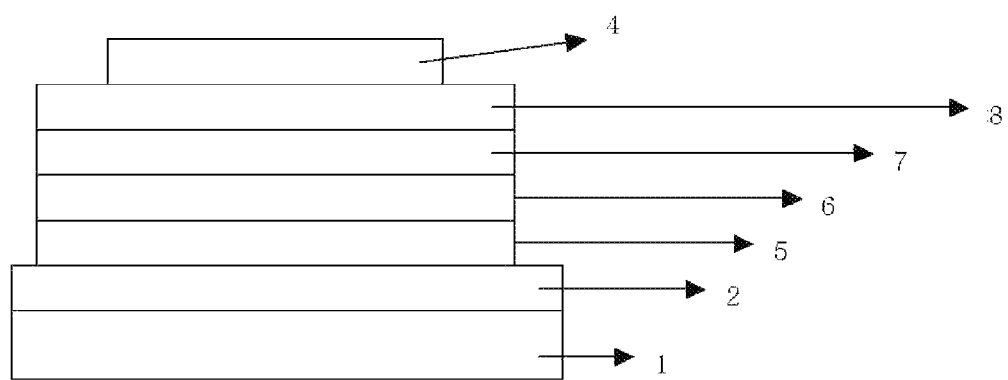
FIG. 2 illustrates an example of an organic light emitting device including a substrate 1, an anode 2, a hole injection layer 5, a hole transport layer 6, a light emitting layer 7, an electron transport layer 8 and a cathode 4.

FIG. 2 illustrates an organic light emitting device having a structure where an anode 2, a hole injection layer 5, a hole transport layer 6, a light emitting layer 7, an electron transport layer 8 and a cathode 4 are sequentially laminated on a substrate 1. In the aforementioned structure, the compound may be included in the hole injection layer 5, the hole transport layer 6, the light emitting layer 7 or the electron transport layer 8.

For example, the organic light emitting device according to the present invention may be manufactured by forming an anode by depositing metal or metal oxides having the conductivity or an alloy thereof on a substrate by using a PVD (physical vapor deposition) method such as sputtering or e-beam evaporation, forming the organic material layer including the hole injection layer, the hole transport layer, the light emitting layer and the electron transport layer thereon, and depositing the material that is capable of being used as a cathode thereon. In addition to this method, the organic light emitting device may be manufactured by sequentially depositing a cathode material, an organic material layer and an anode material on a substrate.

The organic material layer may have a multilayered structure including a hole injection layer, a hole transport layer, a light emitting layer, an electron transport layer and the like, but is not limited thereto and may have a single layer structure. Further, the organic material layer may be manufactured to have the smaller number of layers by using various polymer materials and by not a deposition method but a solvent process, for example, a method such as spin coating, dip coating, doctor blading, screen printing, inkjet printing or a heat transferring method.

It is preferable that the anode material be, in general, a material having the large work function so as to smoothly perform hole injection into the organic material layer. Specific examples of the anode material that is capable of being used in the present invention include metal such as vanadium, chrome, copper, zinc and gold, or an alloy thereof; metal oxides such as zinc oxides, indium oxides, indium tin oxides (ITO) and indium zinc oxides (IZO); a combination of metal and oxides such as $ZnO:Al$ or $SnO_2:Sb$; conductive polymers such as poly(3-methyl compound), poly[3,4-(ethylene-1,2-dioxy) compound](PEDT), polypyrole and polyaniline and the like, but are not limited thereto.

It is preferable that the cathode material be, in general, a material having a small work function so as to smoothly perform electron injection into the organic material layer. Specific examples of the cathode material include metal such as magnesium, calcium, sodium, potassium, titanium, indium, yttrium, lithium, gadolinium, aluminum, silver, tin and lead or an alloy thereof; a multilayered structure material such as $LiF/Al$ or $LiO_2/Al$ and the like, but are not limited thereto.

The hole injection material is a material that is capable of well receiving holes from the anode at a low voltage, and it is preferable that the HOMO (highest occupied molecular orbital) of the hole injection material be a value between the work function of the anode material and the HOMO of the organic material layer therearound. Specific examples of the hole injection material include metal porphyrine, oligothiophene, an arylamine-based organic material, a hexanitrile-hexaazatriphenylene-based organic material, a quinacridone-based organic material, a perylene-based organic material, anthraquinone, polyaniline, a polycompound-based conductive polymer and the like, but are not limited thereto.

The hole transport material is a material that is capable of transporting the holes from the anode or the hole injection layer and transferring the holes to the light emitting layer, and is preferably a material having large mobility to the holes. Specific examples thereof include an arylamine-based organic material, a conductive polymer, a block copolymer in which a conjugate portion and a non-conjugate portion are present together and the like, but are not limited thereto.

The light emitting material is a material that receives the holes and the electrons from the hole transport layer and the electron transport layer and combines the holes and the electrons to emit light in a visible ray region, and is preferably a material having excellent photon efficiency to fluorescence or phosphorescence. Specific examples thereof include a 8-hydroxy-quinoline aluminum complex (Alq$_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene and the like, but are not limited thereto.

The organic material layer including the compound represented by Formula 1 may include the compound represented by Formula 1 as a host, and may be used together with an iridium-based (Ir) dopant.

The iridium-based complex used as the dopant is as follows.

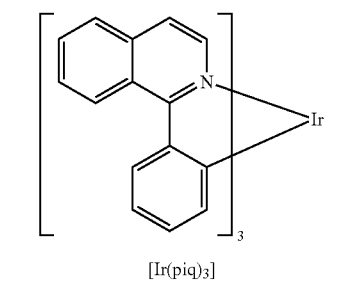

[Ir(piq)$_3$]

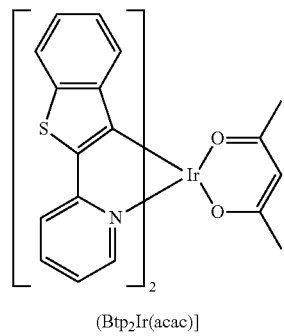

(Btp$_2$Ir(acac))

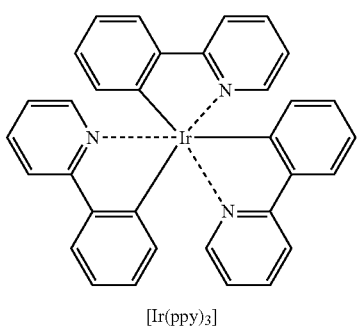

[Ir(ppy)$_3$]

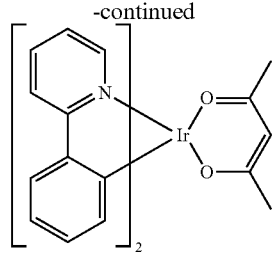

[[Ir(ppy)$_2$(acac)]]

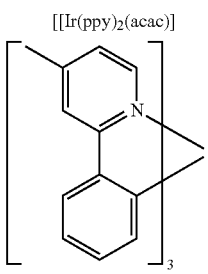

[Ir(mpyp)$_3$]

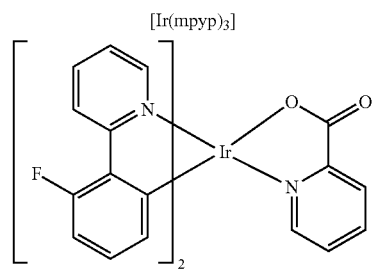

[F$_2$Irpic]

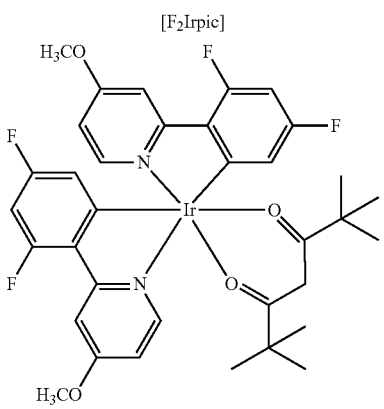

[(F$_2$ppy)$_2$Ir(tmd)]

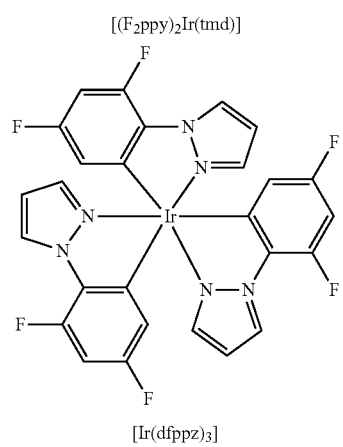

[Ir(dfppz)$_3$]

The electron transport material is a material that is capable of receiving the electrons well from the cathode and transferring the electrons to the light emitting layer, and is preferably a material having large mobility to the electrons. Specific examples thereof include a 8-hydroxyquinoline Al complex; a complex including Alq$_3$; an organic radical compound; a hydroxyflavone metal complex and the like, but are not limited thereto.

The organic light emitting device according to the present invention may be a top emission type, a bottom emission type, or a both-sided emission type according to the used material.

The compound according to the present invention may be applied to an organic electronic device such as an organic solar cell, an organic photoconductor and an organic transistor by the principle that is similar to the principle applied to the organic light emitting device.

MODE FOR INVENTION

The method for manufacturing the compound of Formula 1 and the manufacturing of the organic light emitting device using the same will be described in detail in the following Examples. However, the following Examples are set forth to illustrate the present invention, but the scope of the present invention is not limited thereto.

Synthetic Example 1

Preparation Example 1

Preparation of the Material Represented by Formula 1-1-2

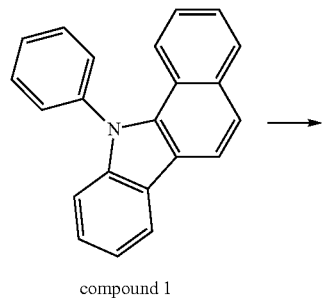

compound 1

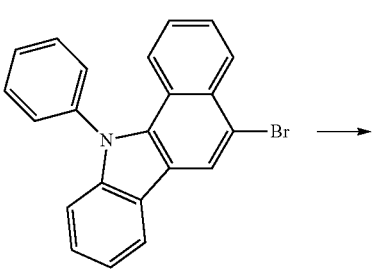

compound 2

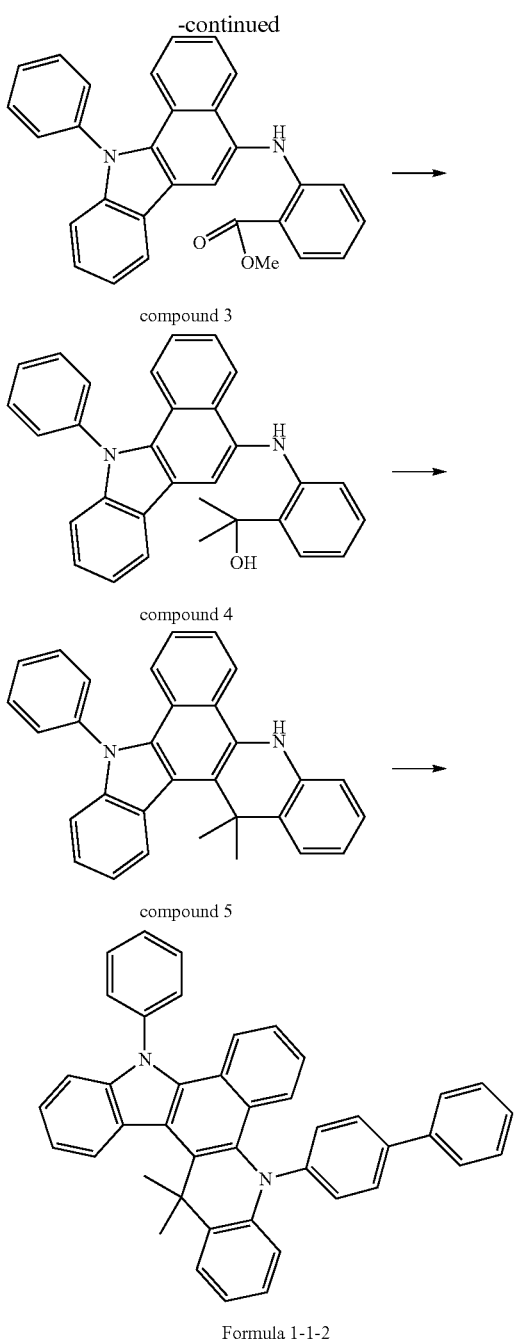

<Preparation of Compound 1>

Benzo[a]carbazole (CAS No. 239-01-0) (20 g, 92.1 mmol), bromobenzene (15.9 g, 101 mmol), sodium tert-butoxide (11.5 g, 120 mmol), bis(tritert-butylphosphine)palladium (0.46 g, 0.9 mmol) and 300 ml of xylene were added to the 500 ml round bottom flask, and agitated and refluxed for 7 hours. Cooling was performed to normal temperature, and 20 g of cellite 545 was added thereto and agitated for 30 min. The reaction solution was filtered, and distilled under reduced pressure to concentrate. Recrystallization was performed by chloroform and ethanol to obtain compound 1 (21.5 g, 73.3 mmol) at a yield of 79.6%. MS: [M+H]$^+$=294

<Preparation of Compound 2>

Compound 1 (18 g, 61.4 mmol) was added to 500 ml of the round bottom flask, and 350 ml of chloroform was added thereto, agitated and cooled to 0° C. N-bromosuccinimide (10.9 g, 61.4 mmol) was slowly added thereto, and then agitated at normal temperature for 5 hours. After the reaction was finished, 100 ml of the sodium thiosulfate aqueous solution was added and agitated for 20 min, and the organic layer was then separated. The separated organic layer was washed by 200 ml of the sodium chloride aqueous solution and then dried by magnesium sulfate anhydride. The solution was filtered, concentrated under reduced pressure, and recrystallized by chloroform and ethanol to obtain compound 2 (17.1 g, 45.9 mmol) at a yield of 74.8%. MS: $[M+H]^+$=373

<Preparation of Compound 3>

Compound 2 (15 g, 40.3 mmol), methyl anthranilate (6.7 g, 44.3 mmol), cesium carbonate (19.5 g, 60 mmol), bis(tritert-butylphosphine)palladium (0.2 g, 0.4 mmol) and 300 ml of toluene were added to the 500 ml round bottom flask, and agitated and refluxed for 7 hours. Cooling was performed to normal temperature, and 20 g of cellite 545 was added thereto and agitated for 30 min. The reaction solution was filtered, and distilled under reduced pressure to concentrate. Column purification was performed to obtain compound 3 (12.1 g, 27.3 mmol) at a yield of 61.7%. MS: $[M+H]^+$=443

<Preparation of Compound 4>

Compound 3 (10 g, 22.6 mmol) and 300 ml of anhydrous tetrahydrofuran were added to 500 ml of the round bottom flask, agitated, and cooled to −78° C. Methyl lithium (1.6M ether solution; 49.4 ml, 79.1 mmol) was slowly added thereto, and then agitated for 2 hours. 10 ml of ethanol was added thereto, and the temperature was increased to normal temperature. 100 ml of the sodium chloride aqueous solution was added to the organic layer, and agitated for 20 min, and the organic layer was separated. The resulting material was distilled under reduced pressure to concentrate, and then subjected to column purification to obtain compound 4 (6.9 g, 15.6 mmol) at a yield of 69%. MS: $[M-H_2O]^+$=424

<Preparation of Compound 5>

Compound 4 (6.3 g, 14.2 mmol) and 100 ml of glacial acetic acid were added to the 250 ml round bottom flask, and 0.2 ml of concentrated sulfuric acid was slowly added thereto and agitated for 3 hours. After the reaction was finished, the reaction solution was poured onto 400 ml of water and agitated for 30 min. After extraction was performed twice by 200 ml of chloroform, the organic layer was washed by 300 ml of the sodium chloride aqueous solution. The organic layer was dried by magnesium sulfate anhydride and then filtered. The resulting material was distilled under reduced pressure to concentrate, and then subjected to column purification to obtain compound 5 (4.8 g, 11.3 mmol) at a yield of 79.6%. MS: $[M+H]^+$=425

<Preparation of Formula 1-1-2>

Compound 5 (4.5 g, 10.6 mmol), 4-bromobiphenyl (2.7 g, 11.6 mmol), sodium tert-butoxide (1.4 g, 14.6 mmol), bis (tritert-butylphosphine)palladium (0.1 g, 0.2 mmol) and 100 ml of xylene were added to the 250 ml round bottom flask, and agitated and refluxed for 13 hours. Cooling was performed to normal temperature, and 6 g of cellite 545 was added thereto and agitated for 30 min. The reaction solution was filtered, and distilled under reduced pressure to concentrate. The column purification was performed to obtain Formula 1-1-2 (4.6 g, 8 mmol) at a yield of 75.2%. MS: $[M+H]^+$=577

Preparation Example 2

Preparation of the Material Represented by Formula 1-1-7

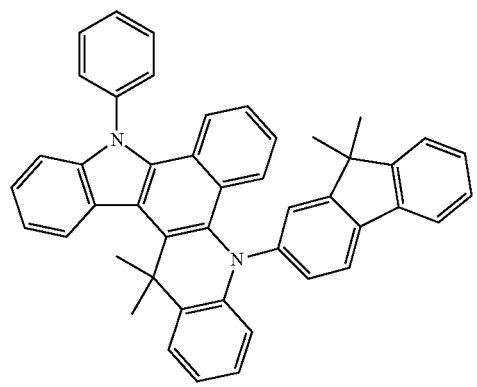 [SMILES: CC1(C)c2ccccc2-c2ccc(N3c4ccccc4C(C)(C)c4c3c3ccccc3c3c4c4ccccc4n3-c3ccccc3)cc21]

<Preparation of Formula 1-1-7>

Compound 5 of Preparation Example 1 (5 g, 11.8 mmol), 2-bromo-9,9'-dimethylfluorene (CAS No. 28320-31-2) (3.6 g, 13.2 mmol), sodium tert-butoxide (1.5 g, 15.3 mmol), bis(tritert-butylphosphine)palladium (0.1 g, 0.2 mmol) and 100 ml of xylene were added to the 250 ml round bottom flask, and agitated and refluxed for 13 hours. Cooling was performed to normal temperature, and 6 g of cellite 545 was added thereto and agitated for 30 min. The reaction solution was filtered, and distilled under reduced pressure to concentrate. The column purification was performed to obtain Formula 1-1-7 (5.1 g, 8.3 mmol) at a yield of 70%. MS: $[M+H]^+$=617

Preparation Example 3

Preparation of the Material Represented by Formula 1-2-14

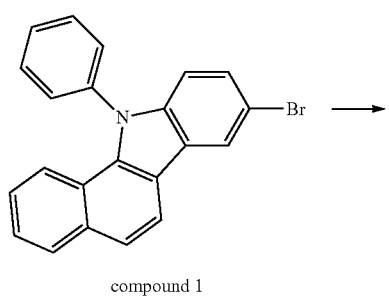

compound 1

-continued

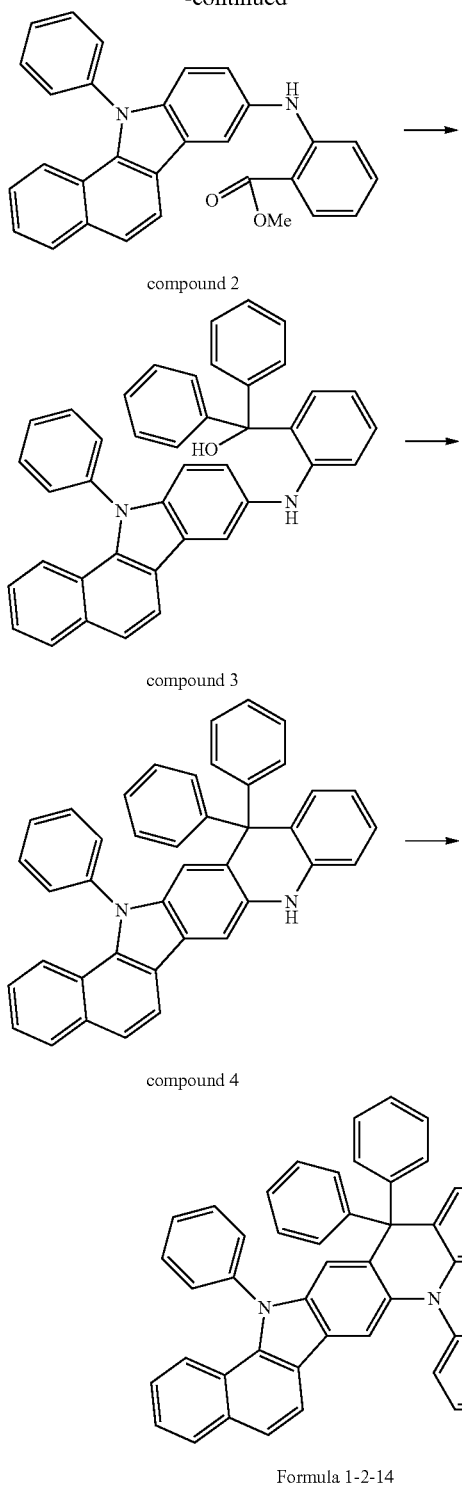

compound 2 compound 3 compound 4

Formula 1-2-14

<Preparation of Compound 1>

8-bromo-11H-benzo[a]carbazole (CAS No. 21064-34-6) (30 g, 101.3 mmol), copper (powder, 3 μm; 12.9 g, 202.6 mmol), potassium carbonate (42 g, 303.9 mmol) and 90 ml of iodobenzene were added to the 250 ml round bottom flask, and agitated and refluxed for 12 hours. Cooling was performed to normal temperature, and 20 g of cellite 545 was added thereto and agitated for 30 min. The reaction solution was filtered, and distilled under reduced pressure to concentrate. Recrystallization was performed by ethanol to obtain compound 1 (30.5 g, 81.9 mmol) at a yield of 80.9%. MS: $[M+H]^+=373$ <Preparation of Compound 2>

Compound 1 (29 g, 77.9 mmol), methyl anthranilate (12.9 g, 85.3 mmol), cesium carbonate (38 g, 116.6 mmol), bis(tritert-butylphosphine)palladium (0.4 g, 0.8 mmol) and 350 ml of toluene were added to the 500 ml round bottom flask, and agitated and refluxed for 7 hours. Cooling was performed to normal temperature, and 30 g of cellite 545 was added thereto and agitated for 30 min. The reaction solution was filtered, and distilled under reduced pressure to concentrate. Column purification was performed to obtain compound 2 (22.1 g, 50 mmol) at a yield of 64.2%. MS: $[M+H]^+=443$ <Preparation of Compound 3>

Compound 2 (21 g, 47.4 mmol) and 300 ml of anhydrous tetrahydrofuran were added to 500 ml of the round bottom flask, agitated, and cooled to 0° C. Phenylmagnesium bromide (3M ether solution; 55.3 ml, 166 mmol) was slowly added thereto, heated to normal temperature, and agitated for 2 hours. 10 ml of ethanol was added thereto, 100 ml of the sodium chloride aqueous solution was added to the organic layer after 10 min and agitated for 20 min, and the organic layer was separated. The resulting material was distilled under reduced pressure to concentrate, and then subjected to column purification to obtain compound 3 (17.3 g, 30.5 mmol) at a yield of 64.4%. MS: $[M-H_2O]^+=548$ <Preparation of Compound 4>

Compound 3 (17.3 g, 30.5 mmol) and 100 ml of glacial acetic acid were added to the 250 ml round bottom flask, and 0.2 ml of concentrated sulfuric acid was slowly added thereto and agitated for 3 hours. After the reaction was finished, the reaction solution was poured onto 400 ml of water and agitated for 30 min. After extraction was performed twice by 200 ml of chloroform, the organic layer was washed by 300 ml of the sodium chloride aqueous solution. The organic layer was dried by magnesium sulfate anhydride and then filtered. The resulting material was distilled under reduced pressure to concentrate, and then subjected to column purification to obtain compound 4 (6.8 g, 12.4 mmol) at a yield of 40.7%. MS: $[M+H]^+=549$ <Preparation of Formula 1-2-14>

Compound 4 (6.5 g, 11.8 mmol), bromobenzene (2.1 g, 13.4 mmol), sodium tert-butoxide (1.4 g, 14.6 mmol), bis(tritert-butylphosphine)palladium (0.1 g, 0.2 mmol) and 100 ml of xylene were added to the 250 ml round bottom flask, and agitated and refluxed for 13 hours. Cooling was performed to normal temperature, and 6 g of cellite 545 was added thereto and agitated for 30 min. The reaction solution was filtered, and distilled under reduced pressure to concentrate. The column purification was performed to obtain Formula 1-2-14 (6.1 g, 9.8 mmol) at a yield of 82.4%. MS: [M+H]$^+$=625

Preparation Example 4

Preparation of the Material Represented by Formula 1-3-2

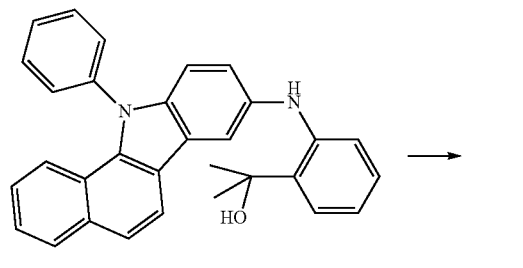
compound 1

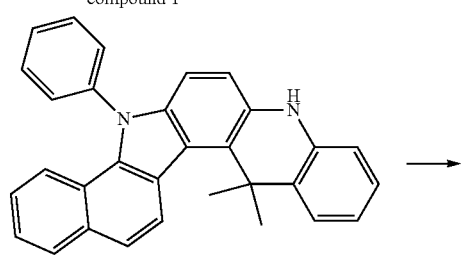
compound 2

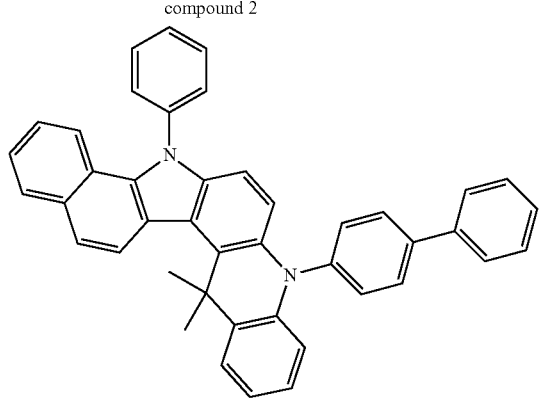
Formula 1-3-2

<Preparation of Compound 1>

Compound 2 of Preparation Example 3 (20 g, 45.2 mol) and 280 ml of anhydrous tetrahydrofuran were added to 500 ml of the round bottom flask, agitated, and cooled to −78° C. Methyl lithium (1.6M ether solution; 98.8 ml, 158.2 mmol) was slowly added thereto, and then agitated for 2 hours. 10 ml of ethanol was added thereto, and the temperature was increased to normal temperature. 100 ml of the sodium chloride aqueous solution was added to the organic layer, and agitated for 20 min, and the organic layer was separated. The resulting material was distilled under reduced pressure to concentrate, and then subjected to column purification to obtain compound 1 (14.9 g, 74.5 mol) at a yield of 69%. MS: [M−H$_2$O]$^+$=424

<Preparation of Compound 2>

Compound 1 (12 g, 27.1 mmol) and 100 ml of glacial acetic acid were added to the 250 ml round bottom flask, and 0.2 ml of concentrated sulfuric acid was slowly added thereto and agitated for 3 hours. After the reaction was finished, the reaction solution was poured onto 400 ml of water and agitated for 30 min. After extraction was performed twice by 200 ml of chloroform, the organic layer was washed by 300 ml of the sodium chloride aqueous solution. The organic layer was dried by magnesium sulfate anhydride and then filtered. The resulting material was distilled under reduced pressure to concentrate, and then subjected to column purification to obtain compound 2 (5.2 g, 12.2 mmol) at a yield of 45.2%. MS: [M+H]$^+$=425

<Preparation of Formula 1-3-2>

Compound 2 (5 g, 11.8 mmol), 4-bromobiphenyl (3 g, 12.9 mmol), sodium tert-butoxide (1.5 g, 15.6 mmol), bis(tritert-butylphosphine)palladium (0.1 g, 0.2 mmol) and 100 ml of xylene were added to the 250 ml round bottom flask, and agitated and refluxed for 13 hours. Cooling was performed to normal temperature, and 6 g of cellite 545 was added thereto and agitated for 30 min. The reaction solution was filtered, and distilled under reduced pressure to concentrate. The column purification was performed to obtain Formula 1-3-2 (4.8 g, 8.3 mmol) at a yield of 70.7%. MS: [M+H]$^+$=577

Preparation Example 5

Preparation of the Material Represented by Formula 1-4-2

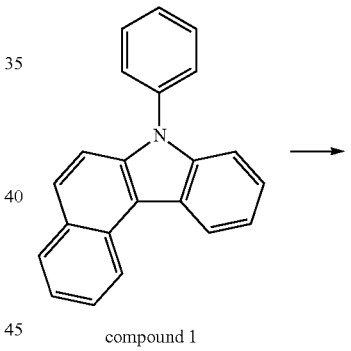
compound 1

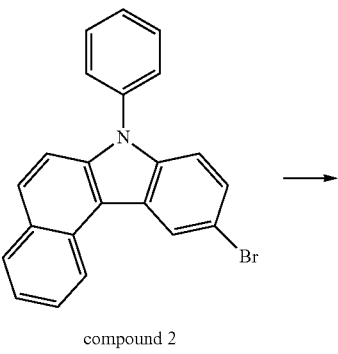
compound 2

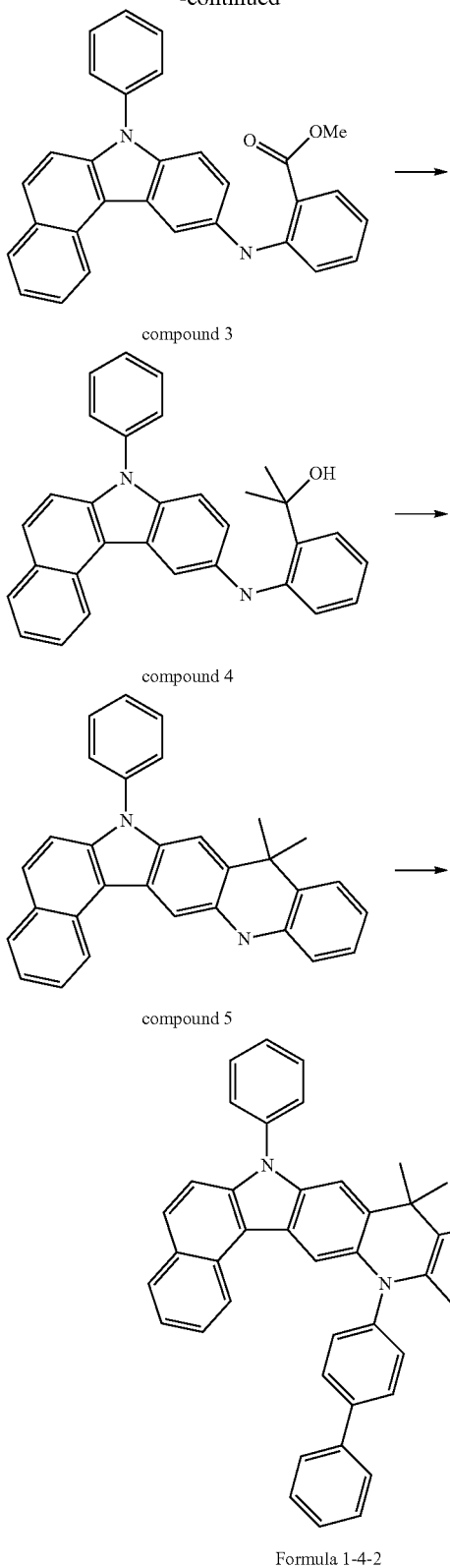

compound 3 compound 4 compound 5

Formula 1-4-2

<Preparation of Compound 1>

7H-benzo<c>carbazole (CAS No. 205-25-4) (20 g, 92.1 mmol), bromobenzene (15.9 g, 101 mmol), sodium tert-butoxide (11.5 g, 120 mmol), bis(tritert-butylphosphine)palla- dium (0.46 g, 0.9 mmol) and 300 ml of xylene were added to the 500 ml round bottom flask, and agitated and refluxed for 7 hours. Cooling was performed to normal temperature, and 20 g of cellite 545 was added thereto and agitated for 30 min. The reaction solution was filtered, and distilled under reduced pressure to concentrate. Recrystallization was performed by chloroform and ethanol to obtain compound 1 (19.7 g, 67.2 mmol) at a yield of 73%. MS: [M+H]$^+$=294

<Preparation of Compound 2>

Compound 1 (19 g, 64.8 mmol) was added to 500 ml of the round bottom flask, and 350 ml of chloroform was added thereto, agitated and cooled to 0° C. N-bromosuccinimide (11.5 g, 64.8 mmol) was slowly added thereto, and then agitated at normal temperature for 5 hours. After the reaction was finished, 100 ml of the sodium thiosulfate aqueous solution was added and agitated for 20 min, and the organic layer was then separated. The separated organic layer was washed by 200 ml of the sodium chloride aqueous solution and then dried by magnesium sulfate anhydride. The solution was filtered, concentrated under reduced pressure, and recrystallized by chloroform and ethanol to obtain compound 2 (16.4 g, 44 mmol) at a yield of 68%. MS: [M+H]+=373

<Preparation of Compound 3>

Compound 2 (15 g, 40.3 mmol), methyl anthranilate (6.7 g, 44.3 mmol), cesium carbonate (19.5 g, 60 mmol), bis(tritert-butylphosphine)palladium (0.2 g, 0.4 mmol) and 300 ml of toluene were added to the 500 ml round bottom flask, and agitated and refluxed for 7 hours. Cooling was performed to normal temperature, and 20 g of cellite 545 was added thereto and agitated for 30 min. The reaction solution was filtered, and distilled under reduced pressure to concentrate. Column purification was performed to obtain compound 3 (7.6 g, 17.2 mmol) at a yield of 42.6%. MS: [M+H]$^+$=443

<Preparation of Compound 4>

Compound 3 (7.3 g, 16.5 mmol) and 150 ml of anhydrous tetrahydrofuran were added to 500 ml of the round bottom flask, agitated, and cooled to −78° C. Methyl lithium (1.6M ether solution; 36.1 ml, 57.8 mmol) was slowly added thereto, and then agitated for 2 hours. 10 ml of ethanol was added thereto, and the temperature was increased to normal temperature. 100 ml of the sodium chloride aqueous solution was added to the organic layer, and agitated for 20 min, and the organic layer was separated. The resulting material was distilled under reduced pressure to concentrate, and then subjected to column purification to obtain compound 4 (5.3 g, 12 mmol) at a yield of 72.6%. MS: [M−H$_2$O]$^+$=424

<Preparation of Compound 5>

Compound 4 (5 g, 11.3 mmol) and 100 ml of glacial acetic acid were added to the 250 ml round bottom flask, and 0.2 ml of concentrated sulfuric acid was slowly added thereto and agitated for 3 hours. After the reaction was finished, the reaction solution was poured onto 400 ml of water and agitated for 30 min. After extraction was performed twice by 200 ml of chloroform, the organic layer was washed by 300 ml of the sodium chloride aqueous solution. The organic layer was dried by magnesium sulfate anhydride and then filtered. The resulting material was distilled under reduced pressure to concentrate, and then subjected to column purification to obtain compound 5 (3.9 g, 9.2 mmol) at a yield of 81.3%. MS: [M+H]$^+$=425

<Preparation of Formula 1-4-2>

Compound 5 (3.7 g, 8.7 mmol), 4-bromobiphenyl (2.2 g, 9.6 mmol), sodium tert-butoxide (1.1 g, 11.3 mmol), bis (tritert-butylphosphine)palladium (0.1 g, 0.2 mmol) and 100 ml of xylene were added to the 250 ml round bottom flask, and agitated and refluxed for 13 hours. Cooling was performed to normal temperature, and 6 g of cellite 545 was added thereto and agitated for 30 min. The reaction solution was filtered, and distilled under reduced pressure to concentrate. The column purification was performed to obtain Formula 1-4-2 (3.6 g, 6.2 mmol) at a yield of 71.6%. MS: [M+H]$^+$=577

Preparation Example 6

Preparation of the Material Represented by Formula 1-4-7

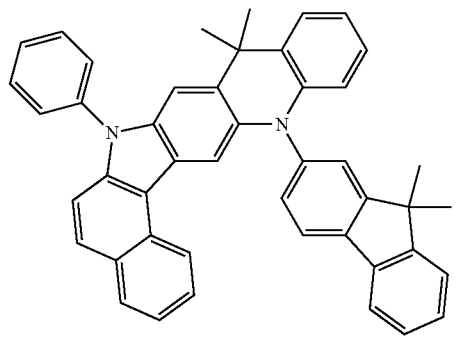 [SMILES: CC1(C)c2ccccc2-c2ccc(N3c4ccccc4C(C)(C)c4cc5c(cc43)c3c4ccccc4ccc3n5-c3ccccc3)cc21]

<Preparation of Formula 1-4-7>

Compound 5 of Preparation Example 5 (8 g, 18.8 mmol), 2-bromo-9,9'-dimethylfluorene (CAS No. 28320-31-2) (5.6 g, 20.5 mmol), sodium tert-butoxide (2.3 g, 23.9 mmol), bis(tritert-butylphosphine)palladium (0.1 g, 0.2 mmol) and 100 ml of xylene were added to the 250 ml round bottom flask, and agitated and refluxed for 13 hours. Cooling was performed to normal temperature, and 6 g of cellite 545 was added thereto and agitated for 30 min. The reaction solution was filtered, and distilled under reduced pressure to concentrate. The column purification was performed to obtain Formula 1-4-7 (7.7 g, 12.5 mmol) at a yield of 66.3%. MS: [M+H]$^+$=617

Preparation Example 7

Preparation of the Material Represented by Formula 1-6-5

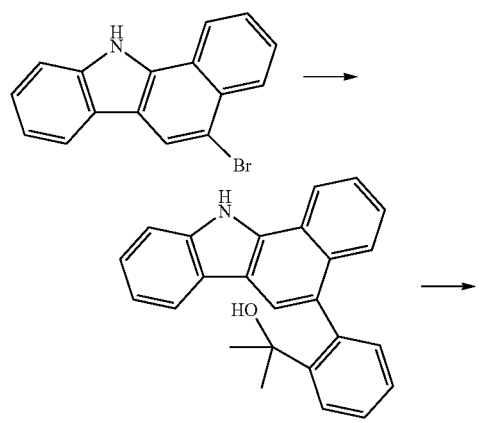

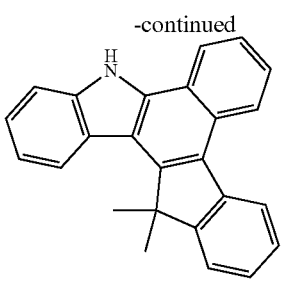

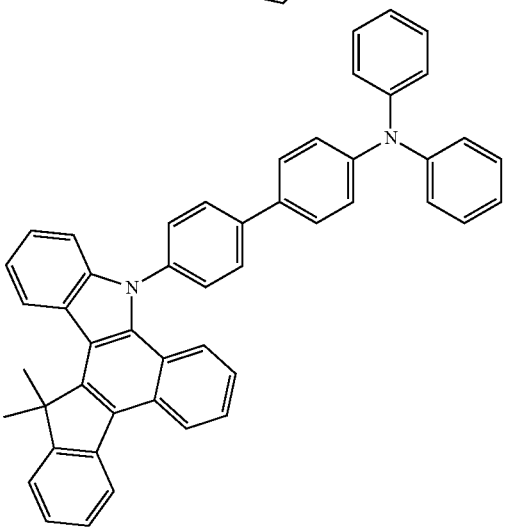

compound 1 compound 2 compound 3 Formula 1-6-5

<Preparation of Compound 1> benzo<c>carbazole (CAS No. 239-01-0) (20 g, 92.1 mmol) was added to the 500 ml round bottom flask, and 300 ml of chloroform was added thereto, agitated and cooled to 0° C. N-bromosuccinimide (16.4 g, 92.1 mmol) was slowly added thereto, and then agitated at normal temperature for 5 hours. After the reaction was finished, 100 ml of the sodium thiosulfate aqueous solution was added and agitated for 20 min, and the organic layer was then separated. The separated organic layer was washed by 200 ml of the sodium chloride aqueous solution and then dried by magnesium sulfate anhydride. The solution was filtered, concentrated under reduced pressure, and recrystallized by normal-hexane to obtain compound 1 (22.9 g, 77.3 mmol) at a yield of 84%. MS: [M+H]+=297

<Preparation of Compound 2>

Compound 1 (21 g, 70.9 mmol), 3,3-dimethyl-3H-benzo[c][1,2]oxaborol-1-ol) (CAS No. 221352-10-9) (12.6 g, 77.8 mmol), sodium hydroxide (7 g, 175 mmol), bis(dibenzylidineacetone)palladium (0.4 g, 0.7 mmol), tricyclohexylphosphine (0.4 g, 1.4 mmol), 200 ml of dioxane and 80 ml of water were added to the 500 ml round bottom flask, and agitated and refluxed for 8 hours. Cooling was performed to normal temperature, and the organic layer was separated. The resulting material was distilled under reduced pressure to concentrate, and then subjected to column purification to obtain compound 1 (17.9 g, 50.9 mmol) at a yield of 71.8%. MS: [M–H$_2$O]$^+$=333

<Preparation of Compound 3>

Compound 2 (15 g, 42.7 mmol) and 120 ml of glacial acetic acid were added to the 250 ml round bottom flask, and 0.2 ml of concentrated sulfuric acid was slowly added thereto and agitated for 3 hours. After the reaction was finished, the reaction solution was poured onto 400 ml of water and agitated for 30 min. After extraction was performed twice by 200 ml of chloroform, the organic layer was washed by 300 ml of the sodium chloride aqueous solution. The organic layer was dried by magnesium sulfate anhydride and then filtered. The resulting material was distilled under reduced pressure to concentrate, and then subjected to column purification to obtain compound 3 (8.4 g, 25.2 mmol) at a yield of 59%. MS: [M+H]$^+$=334

<Preparation of Formula 1-6-5>

Compound 3 (4 g, 12 mmol), 4'-bromo-N,N'-diphenylbiphenyl-4-amine (4.8 g, 12 mmol), sodium tert-butoxide (1.5 g, 15.6 mmol), bis(tritert-butylphosphine)palladium (0.1 g, 0.2 mmol) and 100 ml of xylene were added to the 250 ml round bottom flask, and agitated and refluxed for 13 hours. Cooling was performed to normal temperature, and 6 g of cellite 545 was added thereto and agitated for 30 min. The reaction solution was filtered, and distilled under reduced pressure to concentrate. The column purification was performed to obtain Formula 1-6-5 (5.3 g, 8.1 mmol) at a yield of 67.7%. MS: [M+H]$^+$=653

Example 1

Manufacturing of the Organic Light Emitting Device

A glass substrate (corning 7059 glass) on which a thin film of ITO (indium tin oxide) was applied to a thickness of 800 Å was immersed in distilled water having a detergent dissolved therein, and washed by the ultrasonic wave. In this case, the detergent as used herein was a product commercially available from Fisher Co. and the distilled water was one which had been twice filtered by using a filter commercially available from Millipore Co. ITO was washed for 30 minutes, and washing with ultrasonic waves was then repeated twice for 10 minutes by using distilled water. After the completion of washing with distilled water, washing with ultrasonic waves was carried out by using solvents such as isopropyl alcohol, acetone and methanol, and the resultant product was dried and transported to the plasma washing machine. Further, the substrate was dry-washed by using the oxygen plasma for 5 min, and then transported to the vacuum deposition machine.

Hexanitrile hexaazatriphenylene (hereinafter, referred to as "HAT") that was the compound of the following Formula was deposited in a heat vacuum in a thickness of 50 Å on the prepared ITO transparent electrode to form the thin film. The interfacial property between the substrate and the hole injection layer can be improved by this thin film. Subsequently, Formula 1-1-2 was deposited in a thickness of 1200 Å on the thin film to form a hole transport and electron blocking layer. Subsequently, the light emitting layer was formed in a thickness of 250 Å by doping 10 wt % of Ir(ppy)$_3$ on CBP. BCP was formed as the hole blocking layer in a thickness of 50 Å, and, subsequently, the electron transport layer material of the following Formula was deposited in a thickness of 300 Å to form the electron transport layer. Lithium fluoride (LiF) in a thickness of 12 Å and aluminum in a thickness of 2000 Å were subsequently deposited on the electron transport layer to form a cathode.

In the aforementioned process, a deposition rate of the organic material was maintained at 0.3 to 0.8 Å/sec. In addition, the deposition rate of lithium fluoride of the cathode was maintained at 0.3 Å/sec, and the deposition rate of aluminum was maintained at 1.5 to 2.5 Å/sec. The degree of vacuum during the deposition was maintained at 1 to 3×10$^{-7}$.

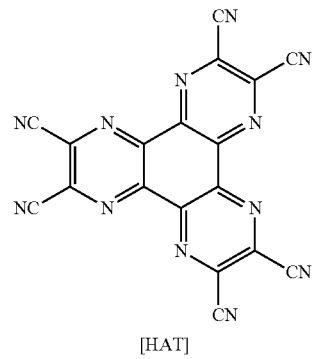

[HAT]

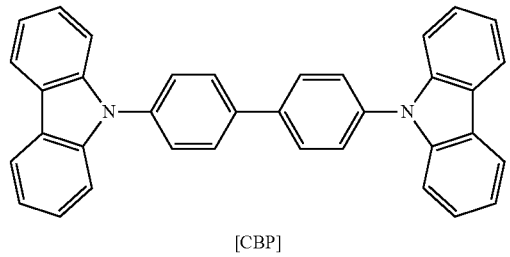

[CBP]

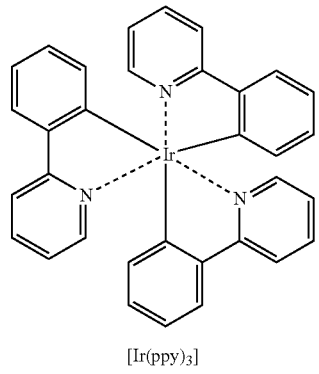

[Ir(ppy)$_3$]

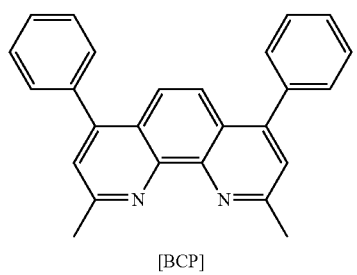

[BCP]

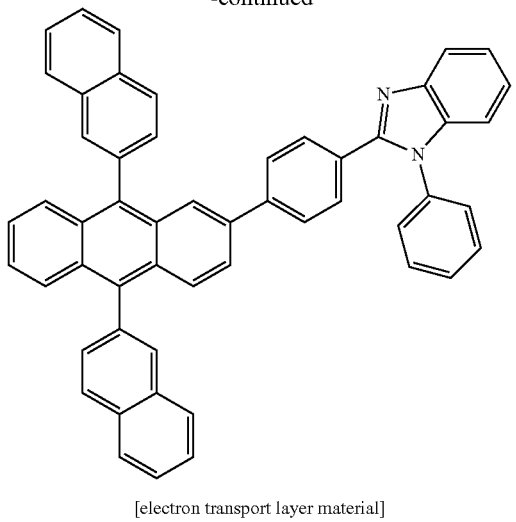

[electron transport layer material]

Example 2

Manufacturing of the Organic Light Emitting Device

The same device was manufactured, except that the compound of Formula 1-1-2 used as the hole transport and electron blocking layer in Example 1 was substituted by the compound of Formula 1-1-7.

Example 3

Manufacturing of the Organic Light Emitting Device

The same device was manufactured, except that the compound of Formula 1-1-2 used as the hole transport and electron blocking layer in Example 1 was substituted by the compound of Formula 1-2-14.

Experimental Example 4

Manufacturing of the Organic Light Emitting Device

The same device was manufactured, except that the compound of Formula 1-1-2 used as the hole transport and electron blocking layer in Example 1 was substituted by the compound of Formula 1-3-2.

Example 5

Manufacturing of the Organic Light Emitting Device

The same device was manufactured, except that the compound of Formula 1-1-2 used as the hole transport and electron blocking layer in Example 1 was substituted by the compound of Formula 1-4-2.

Example 6

Manufacturing of the Organic Light Emitting Device

The same device was manufactured, except that the compound of Formula 1-1-2 used as the hole transport and electron blocking layer in Example 1 was substituted by the compound of Formula 1-4-7.

Example 7

Manufacturing of the Organic Light Emitting Device

The same device was manufactured, except that the compound of Formula 1-1-2 used as the hole transport and electron blocking layer in Example 1 was substituted by the compound of Formula 1-6-5.

Comparative Example

Manufacturing of the Organic Light Emitting Device

The same device was manufactured, except that the compound of Formula 1-1-2 used as the hole transport and electron blocking layer in Example 1 was substituted by NPB.

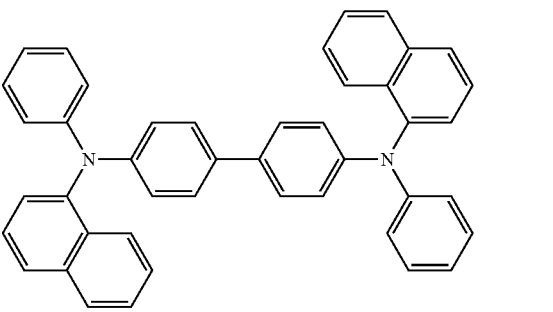

[NPB]

Like Examples 1 to 7 and the Comparative Example, the test results of the organic light emitting device manufactured by using each compound as the hole transport and electron blocking layer material are described in Table 5.

TABLE 5

| Experimental Example (10 mA/cm$^2$) | HTL material | Voltage (V) | Current efficiency (cd/A) |
|---|---|---|---|
| Example 1 | Formula 1-1-2 | 5.19 | 53.5 |
| Example 2 | Formula 1-1-7 | 5.21 | 52.7 |
| Example 3 | Formula 1-2-14 | 5.18 | 53.1 |
| Example 4 | Formula 1-3-2 | 5.11 | 51.9 |
| Example 5 | Formula 1-4-2 | 5.21 | 52.6 |
| Example 6 | Formula 1-4-7 | 5.14 | 53.9 |
| Example 7 | Formula 1-6-5 | 5.3 | 55.9 |
| Comparative Example | NPB | 5.16 | 50.2 |

As shown in Table 5, in the case of the organic light emitting device manufactured by using the compound of the present invention as the hole transport and electron blocking layer, since the compound of the present invention transports holes and blocks electrons as compared to the case where a known material is used, the compound of the present invention exhibits excellent characteristics in view of efficiency, driving voltage and/or stability of the organic light emitting device.

The invention claimed is:
1. A compound represented by any one of Formulas 2 to 5:

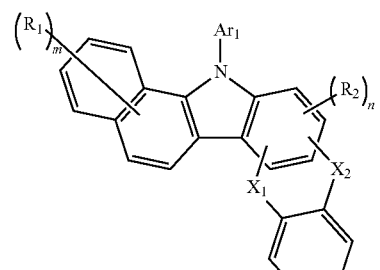
[Formula 2]

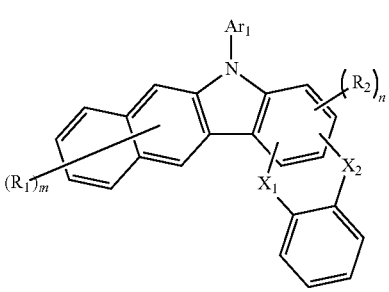
[Formula 3]

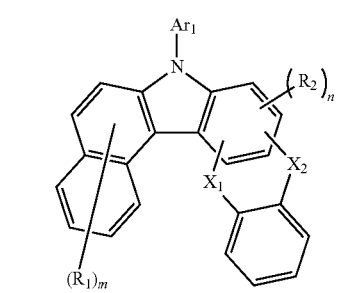
[Formula 4]

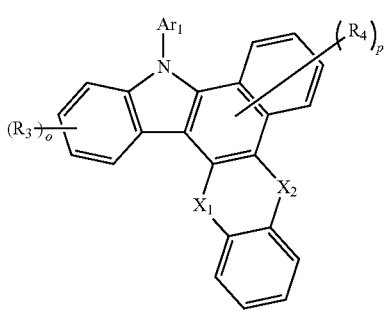
[Formula 5]

wherein,
$Ar_1$ is a substituted or unsubstituted aryl group or a substituted or unsubstituted heterocyclic group,
at least one of $X_1$ and $X_2$ is CR'R", and the rest is CR'R", NR or a direct bond,
R, R' and R" are the same as or different from each other, and each independently selected from the group consisting of hydrogen; heavy hydrogen; a halogen group; a nitrile group; a nitro group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; a substituted or unsubstituted heterocyclic group including one or more of N, O and S atoms, or —N(L)(Y); —CO—N(L)(Y); and —COO-L, L and Y are the same as or different from each other, and each independently selected from the group consisting of hydrogen, a halogen group, an alkyl group, an alkoxy group, a substituted or unsubstituted aryl group, a substituted or unsubstituted arylalkyl group, a substituted or unsubstituted arylalkenyl group, a substituted or unsubstituted heterocyclic group, a substituted or unsubstituted carbazolyl group, a substituted or unsubstituted fluorenyl group, a nitrile group and an acetyl group, m is an integer of 1 to 6,
n is an integer of 1 to 2,
o and p are each an integer of 1 to 4, and
$R_1$ to $R_4$ are the same as or different from each other, and each independently hydrogen, heavy hydrogen, a halogen group, a substituted or unsubstituted alkyl group, a substituted or unsubstituted alkenyl group, a substituted or unsubstituted alkoxy group, a substituted or unsubstituted silyl group, a substituted or unsubstituted arylalkenyl group, a substituted or unsubstituted aryl group, a substituted or unsubstituted heterocyclic group, a substituted or unsubstituted carbazole group, a substituted or unsubstituted arylamine group, a substituted or unsubstituted fluorenyl group or a nitrile group, and Formula 4 is represented by any one of Formulas 1-4, 1-5, 1-9, and 1-10,

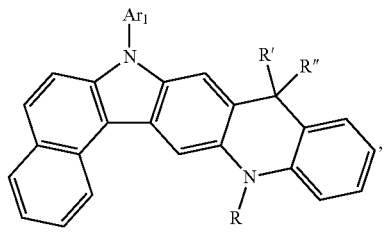
[Formula 1-4]

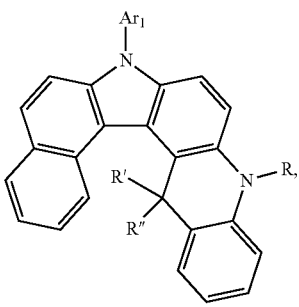
[Formula 1-5]

-continued

[Formula 1-9]

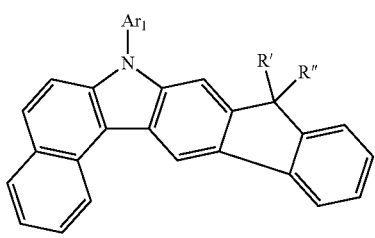

[Formula 1-10]

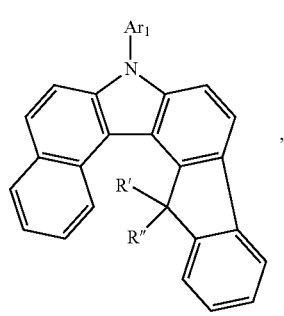

in Formula 1-4, 1-5 and 1-10,

Ar₁ is a substituted or unsubstituted aryl group or a substituted or unsubstituted heterocyclic group, R, R' and R" are the same as or different from each other, and each independently selected from the group consisting of hydrogen; heavy hydrogen; a halogen group; a nitrile group; a nitro group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; a substituted or unsubstituted heterocyclic group including one or more of N, O and S atoms, or —N(L)(Y); —CO—N(L)(Y); and —COO-L, L and Y are the same as or different from each other, and each independently selected from the group consisting of hydrogen, a halogen group, an alkyl group, an alkoxy group, a substituted or unsubstituted aryl group, a substituted or unsubstituted arylalkyl group, a substituted or unsubstituted arylalkenyl group, a substituted or unsubstituted heterocyclic group, a substituted or unsubstituted carbazolyl group, a substituted or unsubstituted fluorenyl group, a nitrile group and an acetyl group, and the compound represented by Formula 1-9 has a substituent group of any one of D-1 to D-22 of the following Table 4,

TABLE 4

| | R' | R" |
|---|---|---|
| D-1 | —CH₃ | —CH₃ |
| D-2 | —CH₃ | —CH₃ |
| D-3 | —CH₃ | —CH₃ |
| D-4 | —CH₃ | —CH₃ |
| D-5 | —CH₃ | —CH₃ |
| D-6 | —CH₃ | —CH₃ |
| D-7 | —CH₃ | —CH₃ |
| D-8 | —CH₃ | —CH₃ |
| D-9 | —CH₃ | —CH₃ |
| D-10 | —CH₃ | —CH₃ |
| D-11 | —CH₃ | —CH₃ |
| D-12 | phenyl | phenyl |
| D-13 | phenyl | phenyl |
| D-14 | phenyl | phenyl |
| D-15 | phenyl | phenyl |
| D-16 | tolyl | tolyl |
| D-17 | tolyl | tolyl |
| D-18 | tolyl | tolyl |
| D-19 | tolyl | tolyl |
| D-20 | tolyl | tolyl |
| D-21 | tolyl | tolyl |
| D-22 | tolyl | tolyl |

| | Ar₁ |
|---|---|
| D-1 | phenyl |
| D-2 | biphenyl |

TABLE 4-continued
| | |
|---|---|
| D-3 | 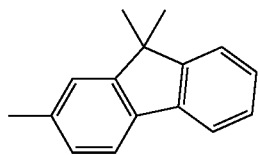 |
| D-4 | 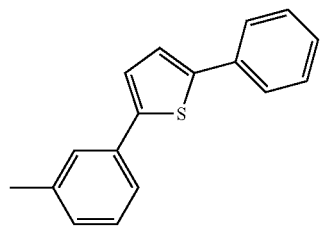 |
| D-5 | 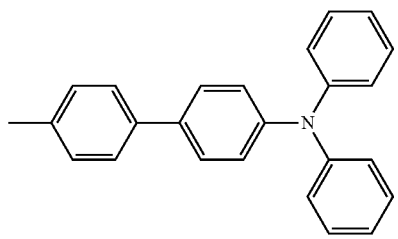 |
| D-6 | 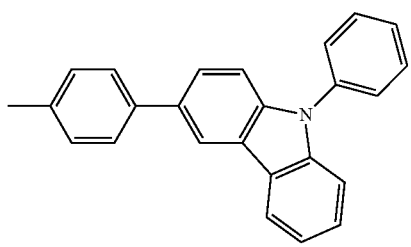 |
| D-7 | 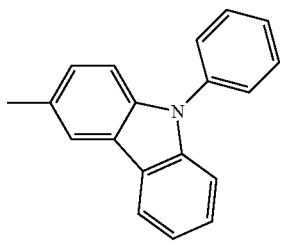 |
| D-8 | 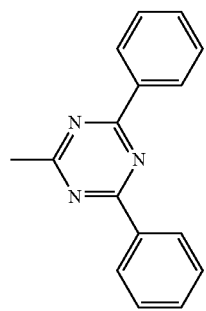 |
| D-9 | 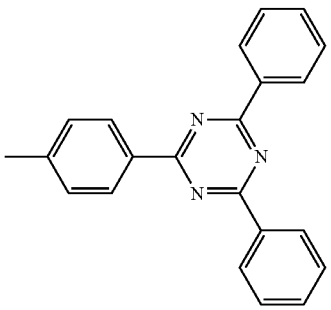 |
| D-10 | 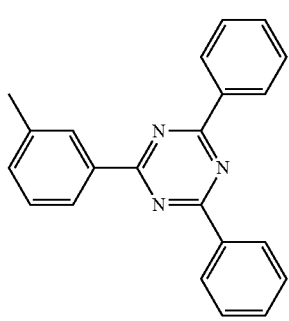 |
| D-11 | 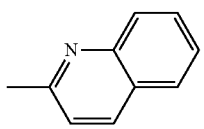 |
| D-12 | 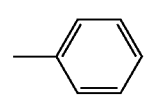 |
| D-13 | 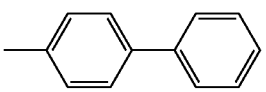 |
| D-14 | 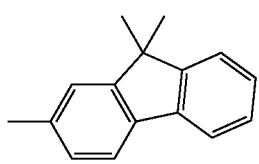 |
| D-15 | 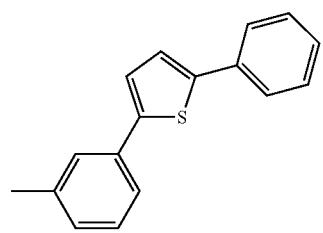 |
| D-16 | 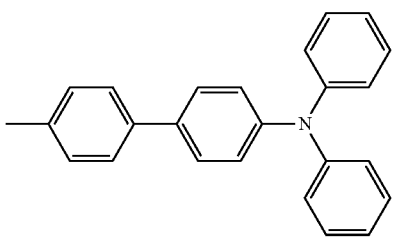 |

TABLE 4-continued
D-17
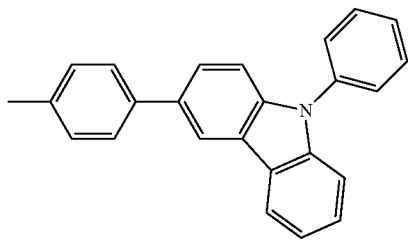 [SMILES: Cc1ccc(-c2ccc3c(c2)c2ccccc2n3-c2ccccc2)cc1]
D-18
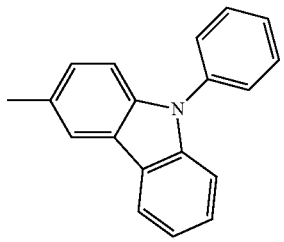 [SMILES: Cc1ccc2c(c1)c1ccccc1n2-c1ccccc1]
D-19
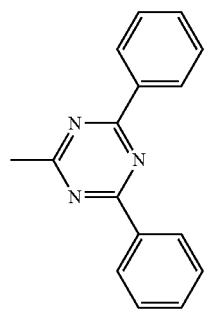 [SMILES: Cc1nc(-c2ccccc2)nc(-c2ccccc2)n1]
D-20
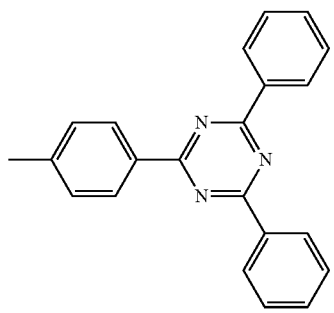 [SMILES: Cc1ccc(-c2nc(-c3ccccc3)nc(-c3ccccc3)n2)cc1]
D-21
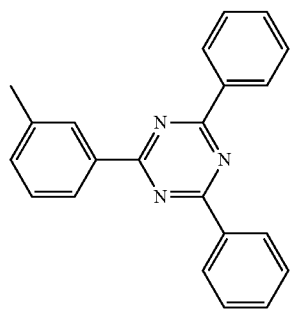 [SMILES: Cc1cccc(-c2nc(-c3ccccc3)nc(-c3ccccc3)n2)c1]
D-22
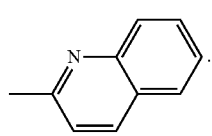
[Formula 1-1]
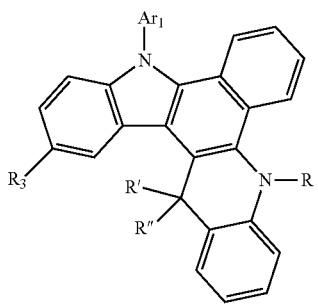
[Formula 1-2]
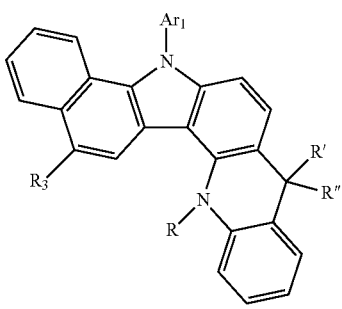
[Formula 1-3]
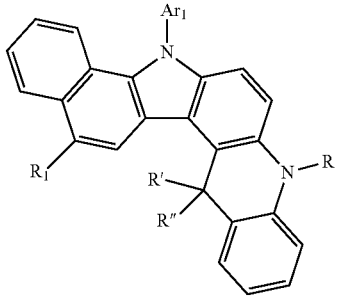
[Formula 1-6]
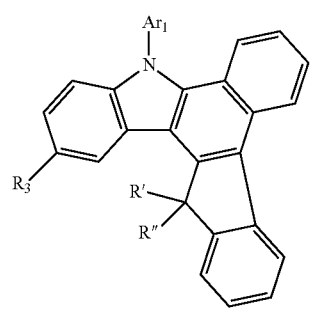
[Formula 1-7]
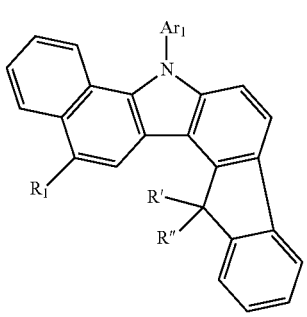
2. The compound of claim 1, wherein Formulas 2 to 5 are represented by any one of Formulas 1-1 to 1-3 and 1-6 to 1-8:

-continued

[Formula 1-8]

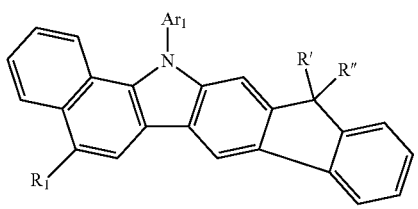

wherein,

Ar₁ is a substituted or unsubstituted aryl group or a substituted or unsubstituted heterocyclic group, R, R' and R'' are the same as or different from each other, and each independently selected from the group consisting of hydrogen; heavy hydrogen; a halogen group; a nitrile group; a nitro group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; a substituted or unsubstituted heterocyclic group including one or more of N, O and S atoms, or —N(L)(Y); —CO—N(L)(Y); and —COO-L, L and Y are the same as or different from each other, and each independently selected from the group consisting of hydrogen, a halogen group, an alkyl group, an alkoxy group, a substituted or unsubstituted aryl group, a substituted or unsubstituted arylalkyl group, a substituted or unsubstituted arylalkenyl group, a substituted or unsubstituted heterocyclic group, a substituted or unsubstituted carbazolyl group, a substituted or unsubstituted fluorenyl group, a nitrile group and an acetyl group, and R₁ and R₃ are the same as or different from each other, and each independently hydrogen, heavy hydrogen, a halogen group, a substituted or unsubstituted alkyl group, a substituted or unsubstituted alkenyl group, a substituted or unsubstituted alkoxy group, a substituted or unsubstituted silyl group, a substituted or unsubstituted arylalkenyl group, a substituted or unsubstituted aryl group, a substituted or unsubstituted heterocyclic group, a substituted or unsubstituted carbazole group, a substituted or unsubstituted arylamine group, a substituted or unsubstituted fluorenyl group or a nitrile group.

3. The compound of claim 2, wherein the compound represented by any one of Formulas 1-1 to 1-3 has a substituent group of any one of A-1 to A-24 of the following Table 1:

TABLE 1

| | R' | R'' | R₁ or R₃ | Ar₁ | R |
|---|---|---|---|---|---|
| A-1 | —CH₃ | —CH₃ | —H | phenyl | phenyl |
| A-2 | —CH₃ | —CH₃ | —H | phenyl | biphenyl |
| A-3 | —CH₃ | —CH₃ | —H | biphenyl | phenyl |
| A-4 | —CH₃ | —CH₃ | —H | N-phenylcarbazolyl | phenyl |
| A-5 | —CH₃ | —CH₃ | —H | phenyl | N-phenylcarbazolyl |
| A-6 | —CH₃ | —CH₃ | —H | 9,9-dimethylfluorenyl | phenyl |

TABLE 1-continued
| | R' | R'' | R₁ or R₃ | Ar₁ | R |
|---|---|---|---|---|---|
| A-7 | —CH₃ | —CH₃ | —H |  | 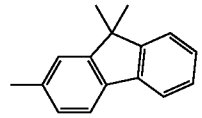 |
| A-8 | —CH₃ | —CH₃ | —H |  | 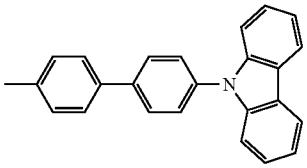 |
| A-9 | —CH₃ | —CH₃ | 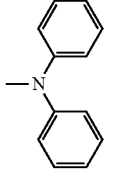 |  | 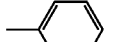 |
| A-10 | —CH₃ | —CH₃ | —H | 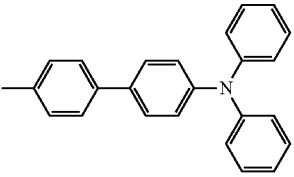 | 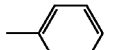 |
| A-11 | —CH₃ | —CH₃ | —H | 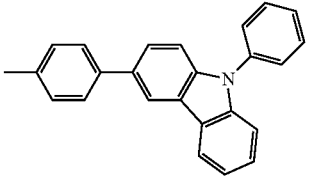 | 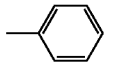 |
| A-12 | —CH₃ | —CH₃ | 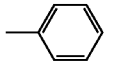 |  | 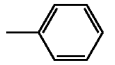 |
| A-13 | —CH₃ | —CH₃ | 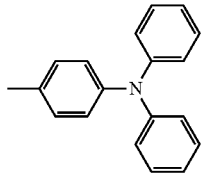 |  | 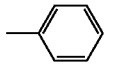 |
| A-14 | 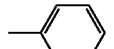 | 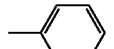 | —H |  | 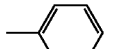 |
| A-15 | 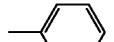 | 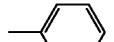 | —H |  | 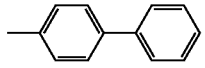 |
| A-16 | 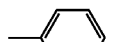 | 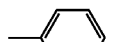 | —H | 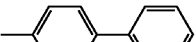 | 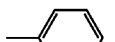 |
| A-17 | 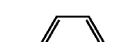 | 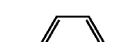 | —H | 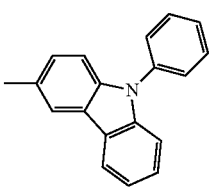 | 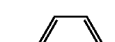 |

TABLE 1-continued

| | R' | R" | R₁ or R₃ | Ar₁ | R |
|---|---|---|---|---|---|
| A-18 | phenyl | phenyl | —H | phenyl | methyl-carbazole-N-phenyl |
| A-19 | phenyl | phenyl | —H | 9,9-dimethylfluorenyl | phenyl |
| A-20 | phenyl | phenyl | —H | phenyl | 9,9-dimethylfluorenyl |
| A-21 | phenyl | phenyl | —H | phenyl | biphenyl-carbazole |
| A-22 | phenyl | phenyl | —N(phenyl)₂ | phenyl | phenyl |
| A-23 | phenyl | phenyl | —H | biphenyl-N(phenyl)₂ | phenyl |
| A-24 | phenyl | phenyl | phenyl | phenyl | phenyl |

4. The compound of claim 1, wherein the compound represented by any one of Formulas 1-4 to 1-5 has a substituent group of any one of B-1 to B-19 of the following Table 2:

TABLE 2

| | R' | R" | Ar₁ | R |
|---|---|---|---|---|
| B-1 | —CH₃ | —CH₃ | phenyl | phenyl |
| B-2 | —CH₃ | —CH₃ | phenyl | biphenyl |

TABLE 2-continued
| | R' | R" | Ar₁ | R |
|---|---|---|---|---|
| B-3 | —CH₃ | —CH₃ | 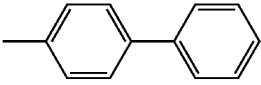 | 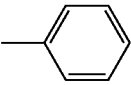 |
| B-4 | —CH₃ | —CH₃ | 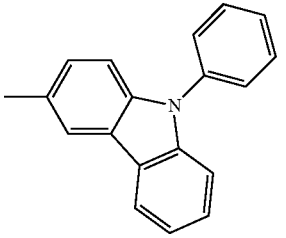 | 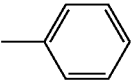 |
| B-5 | —CH₃ | —CH₃ | 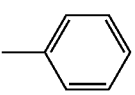 | 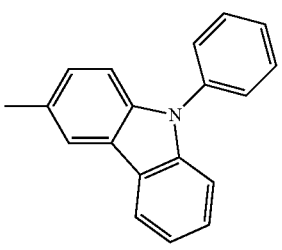 |
| B-6 | —CH₃ | —CH₃ | 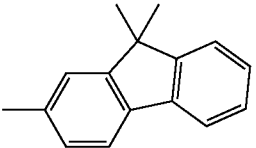 | 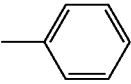 |
| B-7 | —CH₃ | —CH₃ | 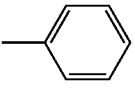 | 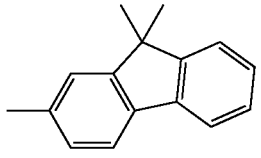 |
| B-8 | —CH₃ | —CH₃ |  | 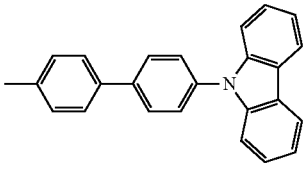 |
| B-9 | —CH₃ | —CH₃ | 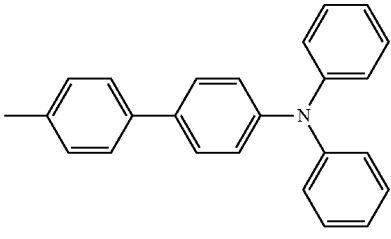 | 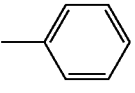 |
| B-10 | —CH₃ | —CH₃ | 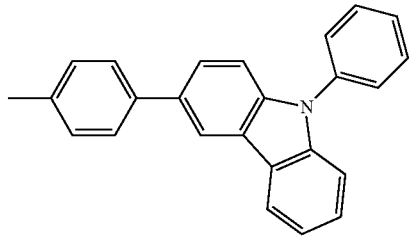 | 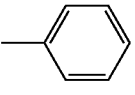 |

TABLE 2-continued
| | R' | R'' | Ar$_1$ | R |
|---|---|---|---|---|
| B-11 | 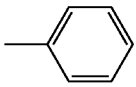 | 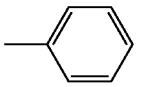 | 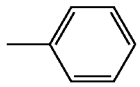 | 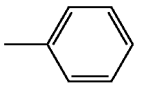 |
| B-12 | 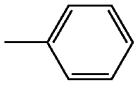 | 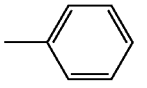 | 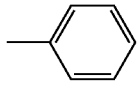 | 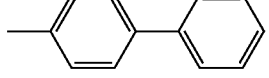 |
| B-13 | 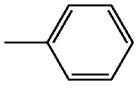 | 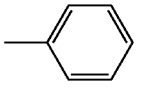 | 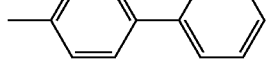 | 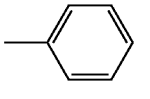 |
| B-14 | 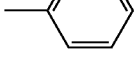 | 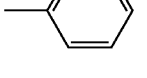 | 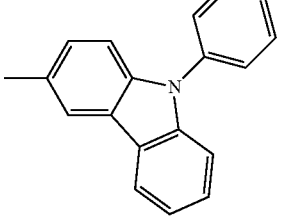 | 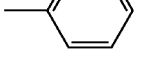 |
| B-15 | 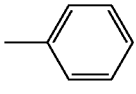 | 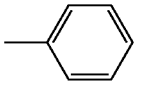 | 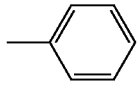 | 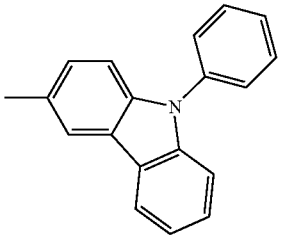 |
| B-16 | 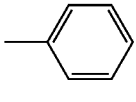 | 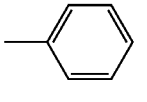 | 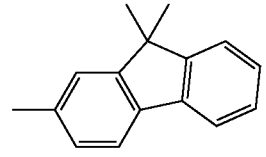 | 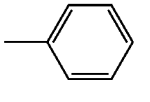 |
| B-17 | 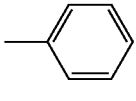 | 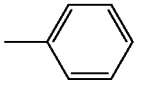 | 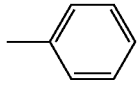 | 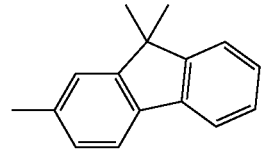 |
| B-18 | 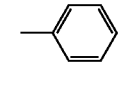 | 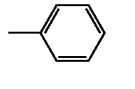 | 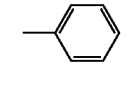 | 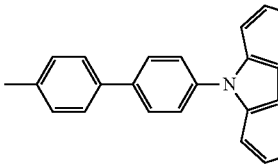 |
| B-19 | 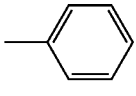 | 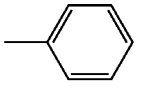 | 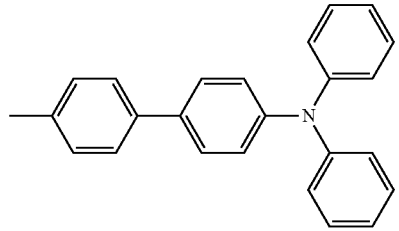 | 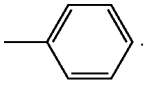 |

5. The compound of claim 2, wherein the compound represented by any one of Formulas 1-6 to 1-8 has a substituent group of any one of C-1 to C-32 of the following Table 3:

TABLE 3

|  | R' | R" | $R_1$ or $R_3$ | $Ar_1$ |
| --- | --- | --- | --- | --- |
| C-1 | —CH$_3$ | —CH$_3$ | —H | phenyl |
| C-2 | —CH$_3$ | —CH$_3$ | —H | biphenyl |
| C-3 | —CH$_3$ | —CH$_3$ | —H | 9,9-dimethylfluorenyl |
| C-4 | —CH$_3$ | —CH$_3$ | —H | 5-phenylthiophen-2-yl |
| C-5 | —CH$_3$ | —CH$_3$ | —H | 4'-(diphenylamino)biphenyl-4-yl |
| C-6 | —CH$_3$ | —CH$_3$ | —H | 4-(9-phenyl-9H-carbazol-3-yl)phenyl |
| C-7 | —CH$_3$ | —CH$_3$ | —H | 9-phenyl-9H-carbazol-3-yl |
| C-8 | —CH$_3$ | —CH$_3$ | —H | 4,6-diphenyl-1,3,5-triazin-2-yl |

TABLE 3-continued

| | R' | R" | R₁ or R₃ | Ar₁ |
|---|---|---|---|---|
| C-9 | —CH₃ | —CH₃ | —H | 4,6-diphenyl-1,3,5-triazin-2-yl-phenyl (para) |
| C-10 | —CH₃ | —CH₃ | —H | 4,6-diphenyl-1,3,5-triazin-2-yl-phenyl (meta) |
| C-11 | —CH₃ | —CH₃ | —H | quinolin-2-yl |
| C-12 | —CH₃ | —CH₃ | N,N-diphenylamino | phenyl |
| C-13 | —CH₃ | —CH₃ | 4-(N-phenylamino)biphenyl | phenyl |
| C-14 | —CH₃ | —CH₃ | 9-phenyl-9H-carbazol-3-yl | phenyl |
| C-15 | —CH₃ | —CH₃ | 9-phenyl-6-(p-tolyl)-9H-carbazol-3-yl | phenyl |

TABLE 3-continued

| | R' | R" | R₁ or R₃ | Ar₁ |
|---|---|---|---|---|
| C-16 | —CH₃ | —CH₃ | [1,1':3',1''-terphenyl-4'-yl] | [phenyl] |
| C-17 | [phenyl] | [phenyl] | —H | [phenyl] |
| C-18 | [phenyl] | [phenyl] | —H | [biphenyl] |
| C-19 | [phenyl] | [phenyl] | —H | [9,9-dimethylfluoren-2-yl] |
| C-20 | [phenyl] | [phenyl] | —H | [5-phenylthiophen-2-yl-phenyl] |
| C-21 | [phenyl] | [phenyl] | —H | [4'-(diphenylamino)biphenyl-4-yl] |
| C-22 | [phenyl] | [phenyl] | —H | [9-phenyl-3-(4-phenyl)carbazolyl] |
| C-23 | [phenyl] | [phenyl] | —H | [9-phenylcarbazol-3-yl] |
| C-24 | [phenyl] | [phenyl] | —H | [4,6-diphenyl-1,3,5-triazin-2-yl] |

TABLE 3-continued

| | R' | R" | R₁ or R₃ | Ar₁ |
|---|---|---|---|---|
| C-25 | phenyl | phenyl | —H | 4-(4,6-diphenyl-1,3,5-triazin-2-yl)phenyl |
| C-26 | phenyl | phenyl | —H | 3-(4,6-diphenyl-1,3,5-triazin-2-yl)phenyl |
| C-27 | phenyl | phenyl | —H | quinolin-2-yl |
| C-28 | phenyl | phenyl | diphenylamino | phenyl |
| C-29 | phenyl | phenyl | N-phenyl-N-(biphenyl-4-yl)amino | phenyl |
| C-30 | phenyl | phenyl | 9-phenyl-9H-carbazol-3-yl | phenyl |
| C-31 | phenyl | phenyl | 9-phenyl-6-(4-methylphenyl)-9H-carbazol-3-yl | phenyl |

TABLE 3-continued

| | R' | R'' | R₁ or R₃ | Ar₁ |
|---|---|---|---|---|
| C-32 | phenyl | phenyl | 1,3,5-triphenylbenzen-yl | phenyl |

6. The compound of claim 1, wherein the compound represented by Formula 1-10 has a substituent group of any one of D-1 to D-22 of the following Table 4:

TABLE 4

| | R' | R'' | Ar₁ |
|---|---|---|---|
| D-1 | —CH₃ | —CH₃ | phenyl |
| D-2 | —CH₃ | —CH₃ | biphenyl |
| D-3 | —CH₃ | —CH₃ | 9,9-dimethylfluorenyl |
| D-4 | —CH₃ | —CH₃ | 2,5-diphenylthiophene-yl |
| D-5 | —CH₃ | —CH₃ | 4'-(diphenylamino)biphenyl-4-yl |
| D-6 | —CH₃ | —CH₃ | 3-(9-phenylcarbazol-3-yl)phenyl |

TABLE 4-continued

| | R' | R'' | Ar₁ |
|---|---|---|---|
| D-7 | —CH₃ | —CH₃ | methyl-substituted 9-phenylcarbazole |
| D-8 | —CH₃ | —CH₃ | 4,6-diphenyl-1,3,5-triazin-2-yl |
| D-9 | —CH₃ | —CH₃ | 4-(4,6-diphenyl-1,3,5-triazin-2-yl)phenyl |
| D-10 | —CH₃ | —CH₃ | 3-(4,6-diphenyl-1,3,5-triazin-2-yl)phenyl |
| D-11 | —CH₃ | —CH₃ | quinolin-2-yl |
| D-12 | phenyl | phenyl | phenyl |
| D-13 | phenyl | phenyl | biphenyl |

TABLE 4-continued

| | R' | R'' | Ar₁ |
|---|---|---|---|
| D-14 | phenyl | phenyl | 9,9-dimethyl-2-fluorenyl |
| D-15 | phenyl | phenyl | 2-(3-methylphenyl)-5-phenylthiophene |
| D-16 | phenyl | phenyl | 4'-(diphenylamino)biphenyl-4-yl |
| D-17 | phenyl | phenyl | 3-(9-phenylcarbazol-3-yl)phenyl |
| D-18 | phenyl | phenyl | 9-phenyl-3-methylcarbazol-6-yl |
| D-19 | phenyl | phenyl | 4,6-diphenyl-1,3,5-triazin-2-yl |

TABLE 4-continued

| | R' | R'' | Ar₁ |
|---|---|---|---|
| D-20 | phenyl | phenyl | 4-(4,6-diphenyl-1,3,5-triazin-2-yl)phenyl (para-tolyl linked triazine) |
| D-21 | phenyl | phenyl | 3-(4,6-diphenyl-1,3,5-triazin-2-yl)phenyl (meta-tolyl linked triazine) |
| D-22 | phenyl | phenyl | 2-methylquinolin-yl |

7. An organic light emitting device comprising:
a first electrode,
a second electrode, and
one or more organic material layers interposed between the first electrode and the second electrode,
wherein one or more layers of the organic material layers include the compound of any one of Formulas 2 to 5 claim 1.

8. The organic light emitting device of claim 7, wherein the organic material layer includes at least one layer of an electron injection layer and an electron transport layer, and at least one layer of the electron injection layer and the electron transport layer includes the compound of any one of Formulas 2 to 5.

9. The organic light emitting device of claim 7, wherein the organic material layer includes a light emitting layer, and the light emitting layer includes the compound of any one of Formulas 2 to 5 as a host of the light emitting layer.

10. The organic light emitting device of claim 7, wherein the organic material layer includes one or more layers of layers a hole injection layer, a hole transport layer, and a layer injecting and transporting holes simultaneously, and one layer of the layers includes the compound of any one of Formulas 2 to 5.

11. The organic light emitting device of claim 7, wherein the organic material layer includes the compound represented by any one of Formulas 2 to 5 as a host, and other organic compounds, metal or metal compounds as a dopant.

12. The organic light emitting device of claim 11, wherein the dopant includes an iridium-based (Ir) phosphorescent dopant.

* * * * *